(12) United States Patent
Hwang et al.

(10) Patent No.: US 11,239,334 B2
(45) Date of Patent: Feb. 1, 2022

(54) SEMICONDUCTOR DEVICE

(71) Applicant: Samsung Electronics Co., Ltd., Suwon-si (KR)

(72) Inventors: Yoon Tae Hwang, Seoul (KR); Wandon Kim, Seongnam-si (KR); Geunwoo Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/811,605

(22) Filed: Mar. 6, 2020

(65) Prior Publication Data

US 2021/0057533 A1    Feb. 25, 2021

(30) Foreign Application Priority Data

Aug. 23, 2019    (KR) .......................... 10-2019-0103566

(51) Int. Cl.

| | |
|---|---|
| *H01L 29/417* | (2006.01) |
| *H01L 21/768* | (2006.01) |
| *H01L 23/532* | (2006.01) |
| *H01L 29/08* | (2006.01) |
| *H01L 21/285* | (2006.01) |

(Continued)

(52) U.S. Cl.
CPC .. *H01L 29/41766* (2013.01); *H01L 21/28518* (2013.01); *H01L 21/76843* (2013.01); *H01L 23/53209* (2013.01); *H01L 29/0847* (2013.01); *H01L 29/41791* (2013.01); *H01L 29/45* (2013.01); *H01L 29/78* (2013.01)

(58) Field of Classification Search
CPC ... H01L 29/08; H01L 29/084; H01L 29/0847; H01L 29/41; H01L 29/417; H01L 29/4176; H01L 29/41766; H01L 29/4179; H01L 29/41791; H01L 29/45; H01L 29/78; H01L 23/53; H01L 23/532; H01L 23/532; H01L 23/53209; H01L 21/28; H01L 21/285; H01L 21/2851; H01L 21/28518; H01L 21/76; H01L 21/768; H01L 21/7684; H01L 21/76843
USPC ........................................................ 257/384
See application file for complete search history.

(56) References Cited

U.S. PATENT DOCUMENTS

| | | |
|---|---|---|
| 7,956,463 B2 | 6/2011 | Yang et al. |
| 10,276,432 B2 | 4/2019 | Lin et al. |
| 2011/0006362 A1 | 1/2011 | Hsieh |

(Continued)

FOREIGN PATENT DOCUMENTS

| | | |
|---|---|---|
| JP | 2004-311537 A | 11/2004 |
| KR | 2001-0059520 A | 7/2001 |

(Continued)

*Primary Examiner* — Monica D Harrison
(74) *Attorney, Agent, or Firm* — Harness, Dickey & Pierce, P.L.C.

(57) ABSTRACT

A semiconductor device including a lower contact pattern including a first metal, an upper contact pattern including a second metal, a first resistivity of first metal being greater than a second resistivity of the second metal, and a metal barrier layer between the lower contact pattern and a lower portion of the upper contact pattern, the metal barrier layer including a third metal, the third metal being different from the first and second metals may be provided. A lower width of the upper contact pattern may be less than an upper width of the lower contact pattern.

19 Claims, 23 Drawing Sheets

(51) Int. Cl.
  *H01L 29/45*  (2006.01)
  *H01L 29/78*  (2006.01)

(56) References Cited

U.S. PATENT DOCUMENTS

| | | |
|---|---|---|
| 2018/0090583 A1 | 3/2018 | Choi et al. |
| 2018/0096934 A1 | 4/2018 | Siew et al. |
| 2018/0130702 A1 | 5/2018 | Patil et al. |
| 2018/0144978 A1 | 5/2018 | Lin et al. |
| 2018/0204800 A1* | 7/2018 | Adusumilli ......... H01L 23/5283 |
| 2018/0233445 A1 | 8/2018 | Adusumilli et al. |
| 2018/0240968 A1 | 8/2018 | Briggs et al. |
| 2018/0331045 A1 | 11/2018 | Ameele et al. |
| 2019/0295886 A1* | 9/2019 | Choi ..................... H01L 29/785 |

FOREIGN PATENT DOCUMENTS

| | | |
|---|---|---|
| KR | 10-2018-0035014 A | 4/2018 |
| KR | 10-2018-0037765 A | 4/2018 |

\* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2019-0103566 filed on Aug. 23, 2019, in the Korean Intellectual Property Office, the disclosures of which are hereby incorporated by reference in their entirety.

BACKGROUND

The present inventive concepts relate to semiconductor devices, and more particularly, to semiconductor devices including a low-resistance contact structure.

As a semiconductor device becomes highly integrated, scaling down of elements (e.g., a metal-oxide-semiconductor field effect transistor (MOSFET)) included in the semiconductor device is being gradually accelerated. In such cases, high speed operation of the semiconductor device is difficult to achieve because reduction in critical dimension (CD) increases resistance of wiring lines and capacitance between wiring lines. Therefore, various studies have been conducted to manufacture the semiconductor device having improved performances while overcoming limitations due to high integration of the semiconductor device.

SUMMARY

Some example embodiments of the present inventive concepts provide semiconductor devices including a low-resistance contact structure.

Objects of the present inventive concepts are not limited to the object mentioned above, and other objects which have not been mentioned above will be clearly understood to those skilled in the art from the following description.

According to some example embodiments of the present inventive concepts, a semiconductor device may include a lower contact pattern including a first metal, an upper contact pattern including a second metal, a first resistivity of the first metal being greater than a second resistivity of the second metal, and a metal barrier layer between the lower contact pattern and a lower portion of the upper contact pattern, the metal barrier layer including a third metal, the third metal being different from the first and second metals. A lower width of the upper contact pattern may be less than an upper width of the lower contact pattern.

According to some example embodiments of the present inventive concepts, a semiconductor device may include a semiconductor substrate, an interlayer dielectric layer on the semiconductor substrate, an upper contact pattern penetrating the dielectric layer, the upper contact pattern including a first metal, a lower contact pattern surrounding a lower portion of the upper contact pattern, the lower contact pattern including a second metal, the second metal being different from the first metal, and a metal barrier layer between the lower contact pattern and the lower portion of the upper contact pattern, the metal barrier layer including a third metal different from the first and second metals. The lower contact pattern may have a first upper width and a first lower width less than the first upper width. The upper contact pattern may have a second upper width and a second lower width, both of which are less than the first lower width. A bottom surface of the upper contact pattern may be between a top and a bottom of the lower contact pattern.

According to some example embodiments of the present inventive concepts, a semiconductor device may include a semiconductor substrate including an active pattern, a gate structure running across the active pattern and extending in a first direction, a plurality of source/drain patterns on the active pattern, each of the source/drain patterns being on opposite sides of the gate structure, and a contact structure coupled to a corresponding one of the source/drain patterns.

The contact structure may include a lower contact pattern in the corresponding one of the source/drain patterns, the lower contact pattern including a first metal, an upper contact pattern including a lower portion that is in a recess defined by a top surface of the lower contact pattern, the upper contact pattern including a second metal, and a metal barrier layer between the lower contact pattern and the lower portion of the upper contact pattern, the metal barrier layer including a third metal. A bottom of the upper contact pattern may be lower than a top of the lower contact pattern.

Details of some example embodiments are included in this description and the accompanying drawings.

DETAILED DESCRIPTION

The following will now describe semiconductor devices and methods of fabricating the same according to some example embodiments of the present inventive concepts in conjunction with the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

As used herein, expressions such as "at least one of," when preceding a list of elements, modify the entire list of elements and do not modify the individual elements of the list. Thus, both "at least one of A, B, or C" and "A, B, and C" modify the entire list of elements and do not modify the individual elements of the list, and thus mean either A, B, C or any combination thereof.

Figure 1:
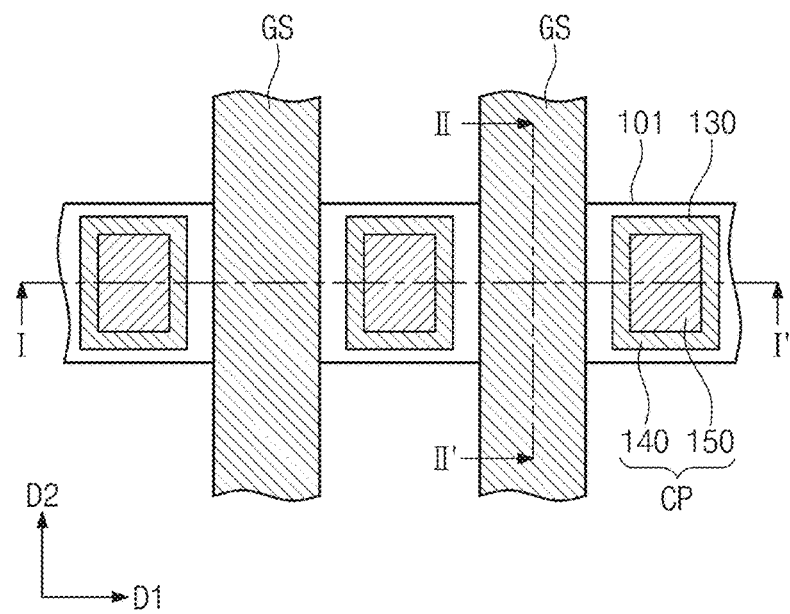
FIG. 1 illustrates a plan view showing a semiconductor device according to some example embodiments of the present inventive concepts.
Figure 2:
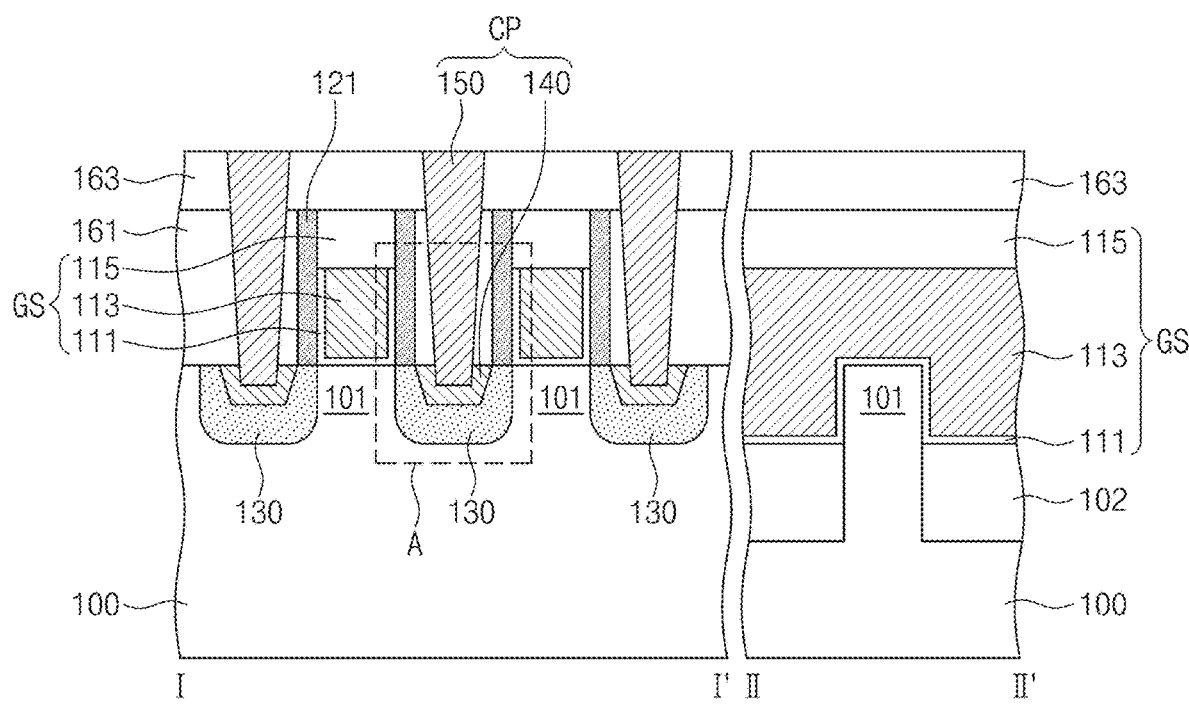
FIG. 2 illustrates a cross-sectional view taken along lines I-I' and II-IF of FIG. 1, showing a semiconductor device according to some example embodiments of the present inventive concepts.
Figure 3A:
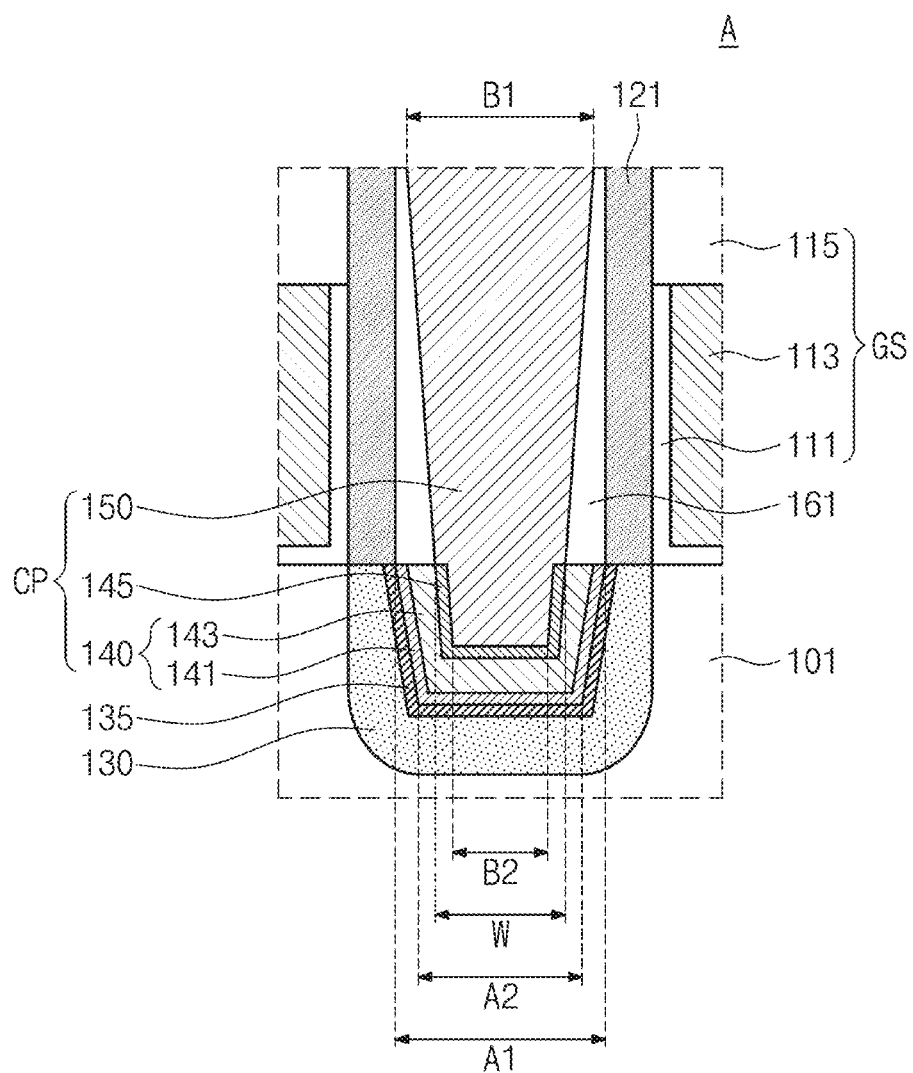
FIGS. 3A and 3B illustrate enlarged views showing section A of FIG. 2.
Figure 3B:
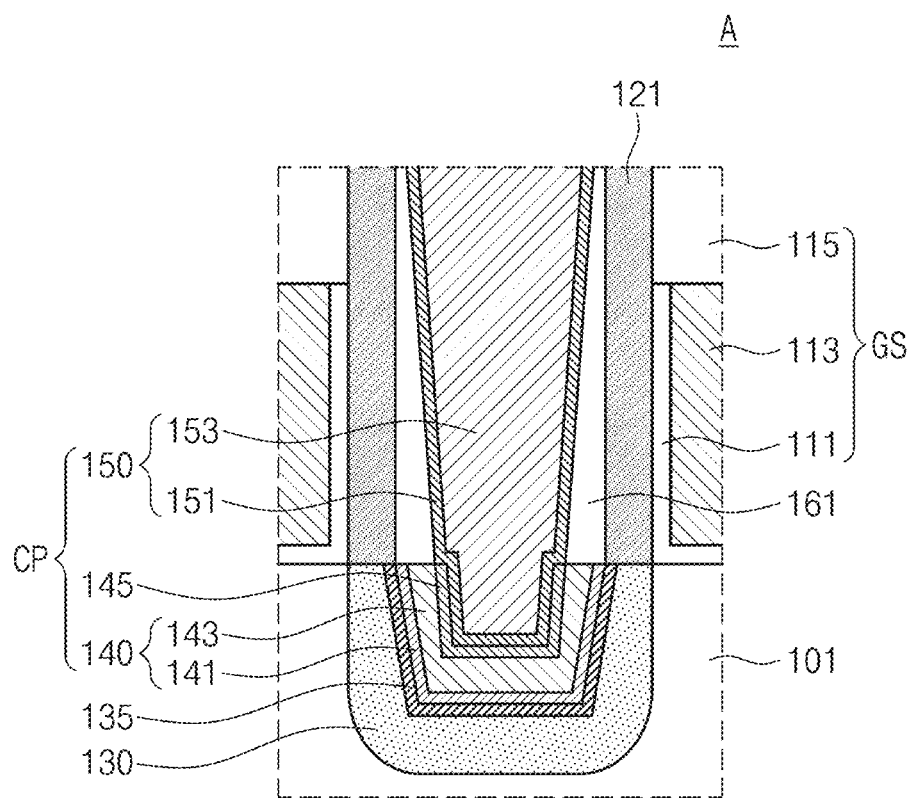
Figure 4:
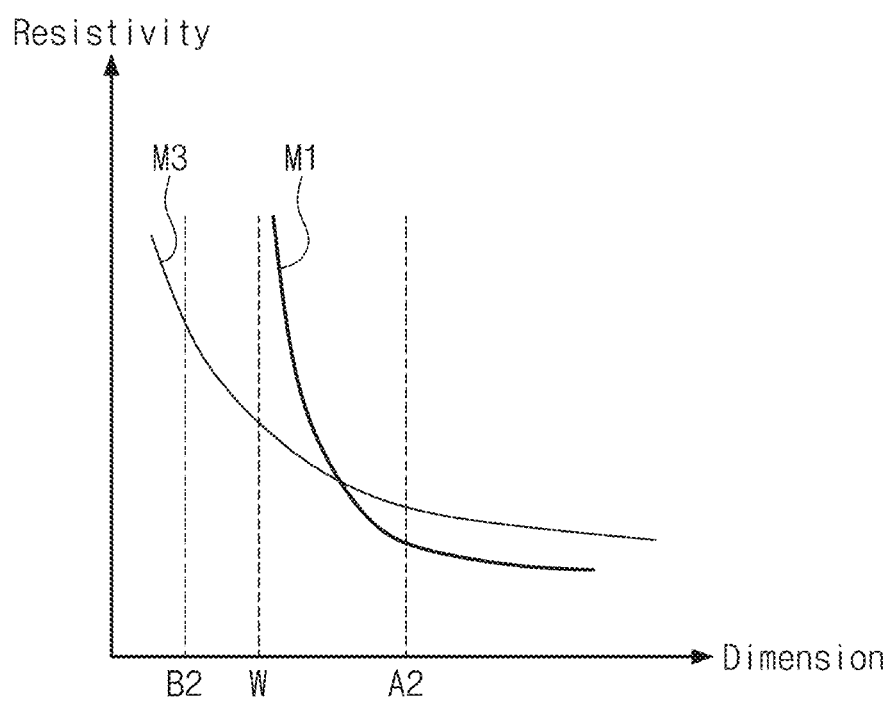
FIG. 4 illustrates a graph showing a relationship between resistivity and either width or dimension of metal included in a contact structure according to some example embodiments of the present inventive concepts.

FIG. 1 illustrates a plan view showing a semiconductor device according to some example embodiments of the present inventive concepts. FIG. 2 illustrates a cross-sectional view taken along lines I-I' and II-IF of FIG. 1, showing a semiconductor device according to some example embodiments of the present inventive concepts. FIGS. 3A and 3B illustrate enlarged views showing section A of FIG. 2. FIG. 4 illustrates a graph showing a relationship between resistivity and either width or dimension of metal included in a contact structure according to some example embodiments of the present inventive concepts.

Referring to FIGS. 1 and 2, a semiconductor substrate 100 may be a compound semiconductor substrate or a semiconductor substrate including silicon, germanium, silicon-germanium, or the like. For example, the semiconductor substrate 100 may be a silicon substrate.

The semiconductor substrate 100 may include an active pattern 101. The active pattern 101 may be a portion of the semiconductor substrate 100 and may be defined by trenches (e.g., a device isolation layer 102) formed on the semiconductor substrate 100. The active pattern 101 may extend in a first direction D1.

The active pattern 101 may be disposed between device isolation layers 102. The device isolation layer 102 may have a top surface below that of the active pattern 101. In other words, the active pattern 101 may protrude upwardly with respect to the top surface of the device isolation layer 102. An upper portion of the active pattern 101 may be exposed by the device isolation layer 102. The device isolation layer 102 may extend in the first direction D1, and may be spaced apart from each other in a second direction D2 intersecting the first direction D1.

The semiconductor substrate 100 may be provided thereon with gate structures GS that run across the active pattern 101. The gate structures GS may extend in the second direction D2 across the active pattern 101, and may be spaced apart from each other in the first direction D1. The gate structures GS may have the same or substantially similar width, and may be spaced apart from each other at a regular interval.

Each of the gate structures GS may include a gate dielectric layer 111, a gate conductive pattern 113, and a capping dielectric pattern 115. Gate spacers 121 may be disposed on opposite sidewalls of each of the gate structures GS.

The gate dielectric layer 111 may extend along the second direction D2, and may conformally cover an upper portion of the active pattern 101. The gate dielectric layer 111 may extend from between the gate conductive pattern 113 and the active pattern 101 to between the gate conductive pattern 113 and the gate spacers 121. For example, the gate dielectric layer 111 may extend from a bottom surface of the gate conductive pattern 113 toward opposite sidewalls of the gate conductive pattern 113. In other words, the gate dielectric layer 111 may upwardly extend from a bottom surface of the gate conductive pattern 113 along sidewalls of the gate conductive pattern 113. The gate dielectric layer 111 may include a high-k dielectric material whose dielectric constant is greater than that of silicon oxide. The gate dielectric layer 111 may include, for example, metal oxide, metal silicate, or metal silicate nitride.

The gate conductive pattern 113 may include a barrier metal pattern (not specifically shown) and a metal pattern (not specifically shown). The barrier metal pattern may include conductive metal nitride (e.g., titanium nitride, tantalum nitride, and/or tungsten nitride). The metal pattern may include a metallic material (e.g., tungsten, aluminum, titanium, and/or tantalum).

The capping dielectric pattern 115 may cover a top surface of the gate conductive pattern 113. The capping dielectric pattern 115 may have a top surface coplanar or substantially coplanar with that of a gap-fill dielectric layer 161. The capping dielectric pattern 115 may include, for example, silicon oxide, silicon nitride, silicon oxynitride, silicon carbon nitride (SiCN), or silicon carbon oxynitride (SiCON). The gate spacers 121 may include a dielectric material, for example, silicon oxide or silicon nitride.

Source/drain regions 130 may be disposed on an upper portion of the active pattern 101 on opposite sides of each of the gate structures GS. Each of the source/drain regions 130 may include n-type or p-type impurities. The active pattern 101 may have a portion (e.g., a channel region) between the source/drain regions 130 that are horizontally spaced apart from each other.

The gap-fill dielectric layer 161 may fill spaces between the gate structures GS and may cover the source/drain regions 130. For example, the top surface of the gap-fill dielectric layer 161 may be coplanar or substantially coplanar with those of the gate structures GS.

The gap-fill dielectric layer 161 may be provided thereon with a first interlayer dielectric layer 163 that covers the top surfaces of the gate structures GS. The gap-fill dielectric layer 161 and the first interlayer dielectric layer 163 may be formed of a dielectric material having an etch selectivity with respect to the gate spacers 121, and may include one or more of a silicon oxide layer, a silicon nitride layer, a silicon oxynitride layer, and a low-k dielectric layer.

Contact structures CP may penetrate the first interlayer dielectric layer 163 and the gap-fill dielectric layer 161, and may be coupled to the source/drain regions 130. According to some example embodiments, each of the contact structures CP may include a lower contact pattern 140, an upper contact pattern 150, and a metal barrier layer between the lower and upper contact patterns 140 and 150.

For example, the lower contact pattern 140 may be disposed in the source/drain region 130. In such a case, the lower contact pattern 140 may be provided in a recess of the source/drain region 130. The lower contact pattern 140 may have a bottom surface at a lower level than that of a top of the source/drain region 130. The lower contact pattern 140 may have a top at a level the same as or substantially similar to a level of the top of the source/drain region 130.

The lower contact pattern 140 may have a first upper width A1 at the top thereof and a first lower width A2, which is less than the first upper width A1, at the bottom thereof. The top portion of the lower contact pattern 140 may be partially removed to form a recess. The recess may have a width less than the first upper width A1. For example, the lower contact pattern 140 may have a width of about 5 nm to about 30 nm.

Referring to FIG. 3A, the lower contact pattern 140 may include a first barrier metal pattern 141 and a first metal pattern 143. The first metal pattern 143 may include a first metal. The first metal may include, for example, one selected from cobalt (Co), titanium (Ti), nickel (Ni), tungsten (W), molybdenum (Mo), and tantalum (Ta). The first barrier metal pattern 141 may conformally cover a bottom surface and a sidewall of the first metal pattern 143. The first barrier metal pattern 141 may be formed of, for example, one or more of Ta, TaN, TaSiN, Ti, TiN, TiSiN, W, and WN.

A second metal barrier layer 145 may be disposed locally in the recess defined by the lower contact pattern 140. The second metal barrier layer 145 may substantially conformally cover the recess of the lower contact pattern 140. The second metal barrier layer 145 may include a second metal different from the first metal of the lower contact pattern 140. The second metal may include, for example, one selected from tungsten (W), molybdenum (Mo), manganese (Mn), indium (In), aluminum (Al), and nickel (Ni). The second metal barrier layer 145 may mitigate prevent diffusion and/or intermixing between the first metal included in the lower contact pattern 140 and a third metal included in the upper contact pattern 150.

The upper contact pattern 150 may penetrate the first interlayer dielectric layer 163 and the gap-fill dielectric layer 161, and may be disposed on the lower contact pattern 140. The upper contact pattern 150 may have a lower portion placed in the recess of the lower contact pattern 140.

The upper contact pattern 150 may have a second upper width B1 at the top thereof and a second lower width B2 at the bottom thereof, and the second lower width B2 is less than the second upper width B1. The second lower width B2 of the upper contact pattern 150 may be less than the first upper and lower widths A1 and A2 of the lower contact pattern 140. For example, the upper contact pattern 150 may have a width of about 3 nm to about 15 nm.

The third metal of the upper contact pattern 150 may be a noble metallic material. The upper contact pattern 150 may include, for example, one or more of rhenium (Re), ruthenium (Ru), rhodium (Rh), palladium (Pd), silver (Ag), osmium (Os), iridium (Ir), platinum (Pt), and gold (Au).

The third metal of the upper contact pattern 150 may be in direct contact with the gap-fill dielectric layer 161, as illustrated in FIG. 3A. For another example, referring to FIG. 3B, likewise the lower contact pattern 140, the upper contact pattern 150 may include an upper barrier metal pattern 151 that conformally covers a bottom surface and a sidewall of the upper metal pattern 153.

A metal silicide layer 135 may be disposed between each of the contact structures CP and each of the source/drain regions 130. The metal silicide layer 135 may be in contact with the bottom surface and a sidewall of the lower contact pattern 140. The metal silicide layer 135 may include, for example, one or more of titanium, nickel, cobalt, tungsten, tantalum, platinum, palladium, and erbium.

Referring to FIG. 4, the first metal M1 of the lower contact pattern 140 may have resistivity that rapidly increases below a certain width W. At the second lower width B2, the third metal M3 of the upper contact pattern 150 may have lower resistivity than that of the first metal M1 below the certain width W.

According to some example embodiments, because a portion of the lower contact pattern 140 is filled with the third metal whose resistivity is lower than the first metal below the certain width W, the contact structure CP may decrease in resistivity. Accordingly, a signal delay through the contact structure CP may be reduced, thereby increasing an operating speed of a semiconductor device.

FIGS. 5A to 5D illustrate cross sectional views taken along line I-I' of FIG. 1, showing a method of fabricating a semiconductor device according to some example embodiments of the present inventive concepts.

Figure 5A:
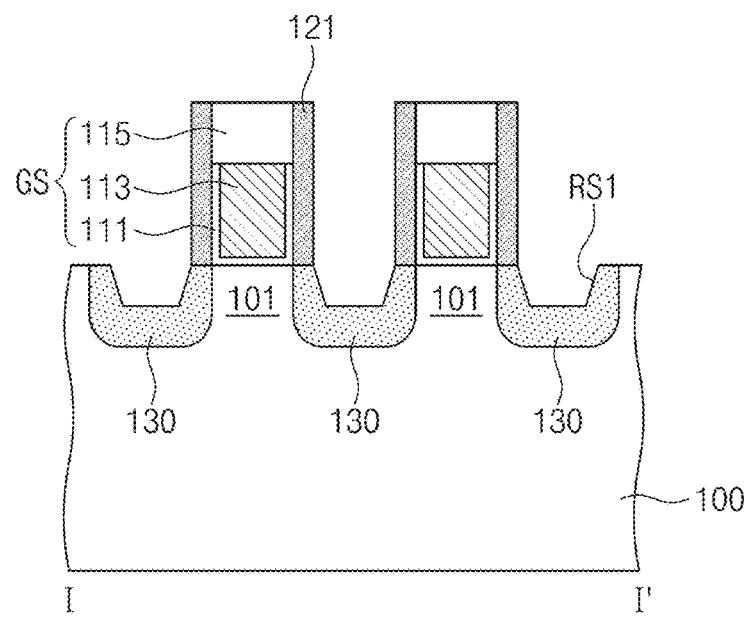
FIGS. 5A to 5D illustrate cross sectional views taken along line I-I' of FIG. 1, showing a method of fabricating a semiconductor device according to some example embodiments of the present inventive concepts.

Referring to FIG. 5A, a semiconductor substrate 100 may be patterned to form an active pattern 101 that vertically protrudes from the semiconductor substrate 100. A device isolation layer (see 102 of FIG. 2) may be formed on opposite sides of the active pattern 101. The device isolation layer 102 may have a top surface that is recessed from a top surface of the active pattern 101.

Gate structures GS may be formed to run across the active pattern 101. The formation of the gate structures GS may include forming a sacrificial gate pattern (not shown), forming gate spacers 121 on opposite sidewalls of the sacrificial gate pattern, sequentially forming a gate dielectric layer 111 and a gate conductive pattern 113 in a gate region between a pair of gate spacers 121 after removing the sacrificial gate pattern, and forming a capping dielectric pattern 115 on the gate dielectric layer 111 and the gate conductive pattern 113.

Source/drain regions 130 may be formed on opposite sides of each of the gate structures GS. As discussed above, the source/drain regions 130 may be in-situ doped with dopants whose conductivity type is opposite to those of corresponding portions of the semiconductor substrate 100, respectively.

The gate spacers 121 may be used as an etching mask to etch portions of the source/drain regions 130 to form a first recess RS1 on each of the source/drain regions 130. A depth of the first recess RS1 may be determined based on electrical characteristics of a semiconductor device.

Figure 5B:
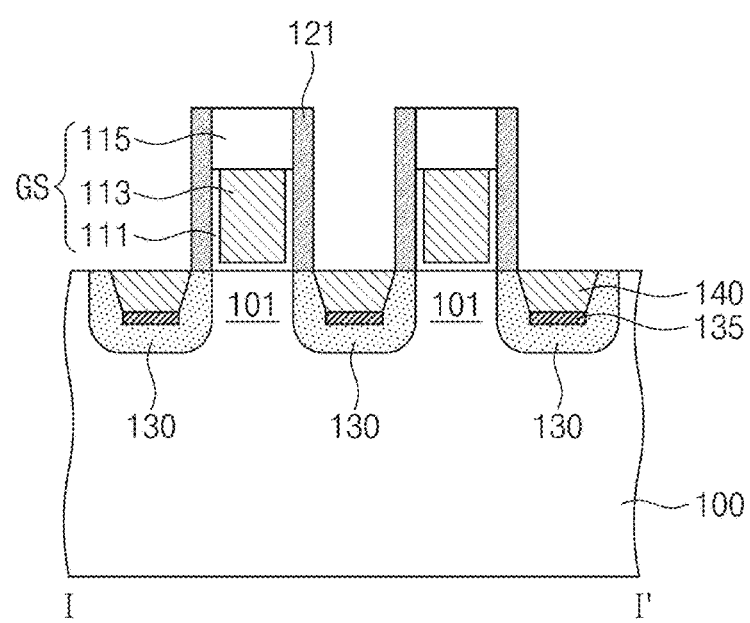

Referring to FIG. 5B, a metal silicide layer 135 and a lower contact pattern 140 may be formed in the first recess RS1 of the source/drain region 130.

The lower contact pattern 140 may be formed by sequentially depositing a first metal barrier layer and a first metal layer in the first recesses RS1 of the source/drain regions 130, and then partially etching the first metal barrier layer and the first metal layer on the top surface of the active pattern 101. The first metal barrier layer may conformally cover surfaces of the first recesses RS1. While the first metal barrier layer and the first metal layer are deposited and annealed, the first metal barrier layer and the source/drain regions 130 may react with each other to form a silicide layer 135 on the surfaces of the first recesses RS1 of the source/drain regions 130.

Figure 5C:
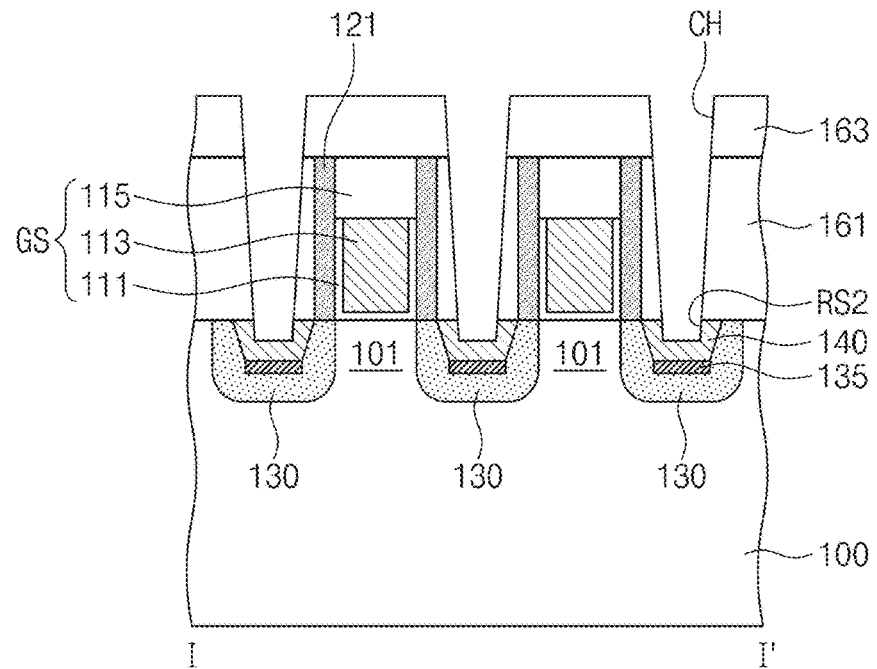

Referring to FIG. 5C, after the lower contact pattern 140 is formed, a gap-fill dielectric layer 161 may be formed to fill spaces between the gate structures GS, and then a first interlayer dielectric layer 163 may be formed to cover the gate structures GS. A contact hole CH may be formed to penetrate the first interlayer dielectric layer 163 and the gap-fill dielectric layer 161, thereby exposing a portion of the lower contact pattern 140. The formation of the contact hole CH may include forming an etching mask on the first interlayer dielectric layer 163, and using the etching mask to sequentially etch a portion of the first interlayer dielectric layer 163, a portion of the gap-fill dielectric layer 161, and a portion of the lower contact pattern 140. Therefore, a top surface of the lower contact pattern 140 may be partially recessed to form a second recess RS2.

Figure 5D:
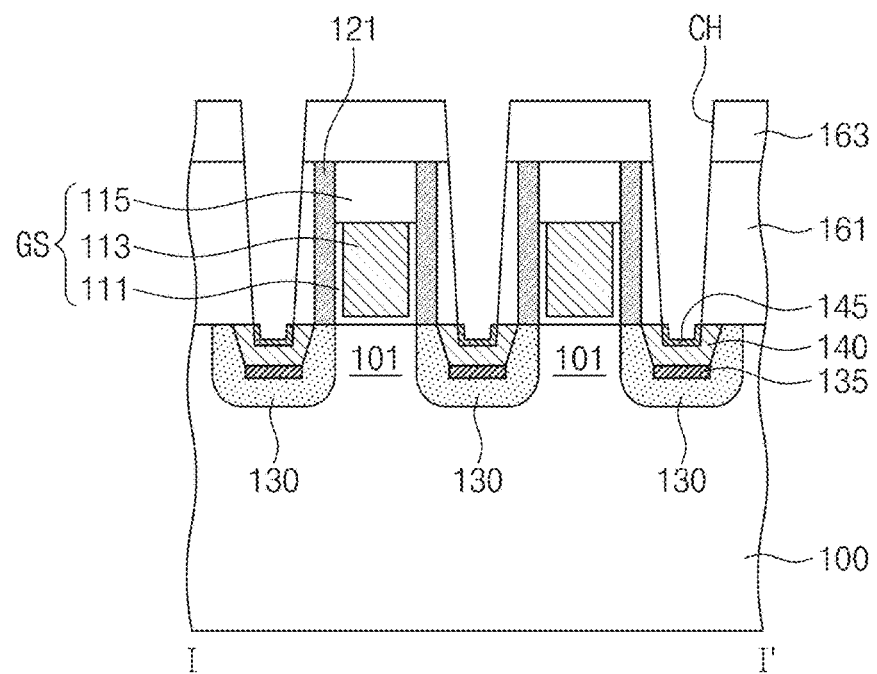

Referring to FIG. 5D, a second metal barrier layer 145 may be formed on a surface of the lower contact pattern 140 exposed to the contact hole CH. The second metal barrier layer 145 may be formed by performing a selective deposition process. The selective deposition process may use a different deposition rate depending on an underlying film quality. The selective deposition process may cause the second metal barrier layer 145 to deposited only on the surface of the lower contact pattern 140 exposed to the contact hole CH.

The second metal barrier layer 145 may include a second metal different from the first metal of the lower contact pattern 140. The second metal barrier layer 145 may be formed of a metal layer or a metal nitride layer including, for example, one or more of tantalum (Ta), titanium (Ti), tungsten (W), cobalt (Co), molybdenum (Mo), manganese (Mn), nickel (Ni), and aluminum (Al). In an example embodiment, the second metal barrier layer 145 may include tungsten (W) or molybdenum (Mo).

An upper contact pattern (see 150 of FIG. 2) may be formed in the contact hole CH in which the second metal barrier layer 145 is formed. The upper contact pattern 150 may be formed by depositing a metal layer including a third metal different from the second metal, and etching the metal layer to expose a top surface of the first interlayer dielectric layer 163. The upper contact pattern 150 may include a noble metallic material. The upper contact pattern 150 may include, for example, one or more of rhenium (Re), ruthenium (Ru), rhodium (Rh), palladium (Pd), silver (Ag), osmium (Os), iridium (Ir), platinum (Pt), and gold (Au).

Figure 6A:
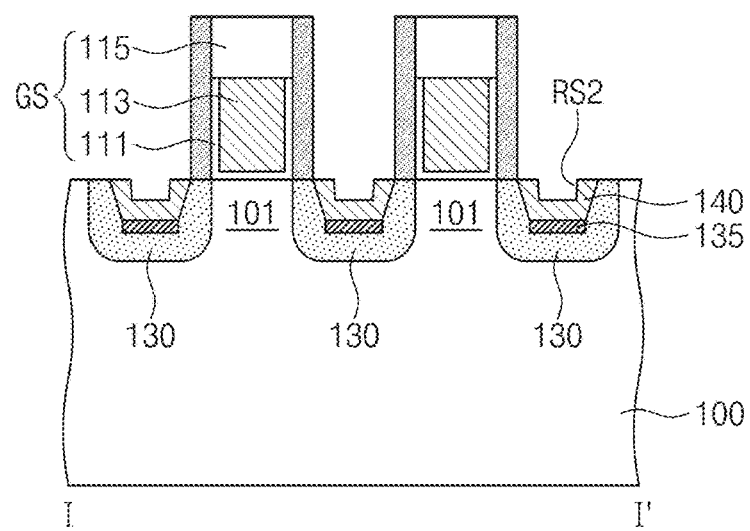
FIGS. 6A to 6C illustrate cross sectional views taken along line I-I' of FIG. 1, showing a method of fabricating a semiconductor device according to some example embodiments of the present inventive concepts.
Figure 6B:
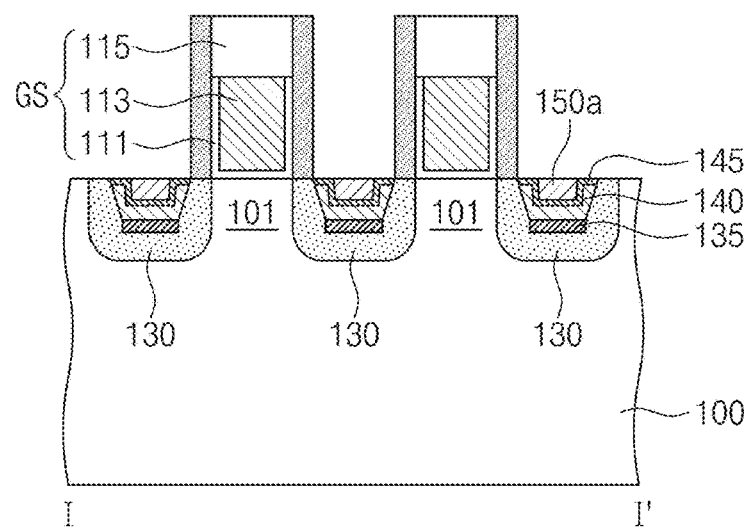
Figure 6C:
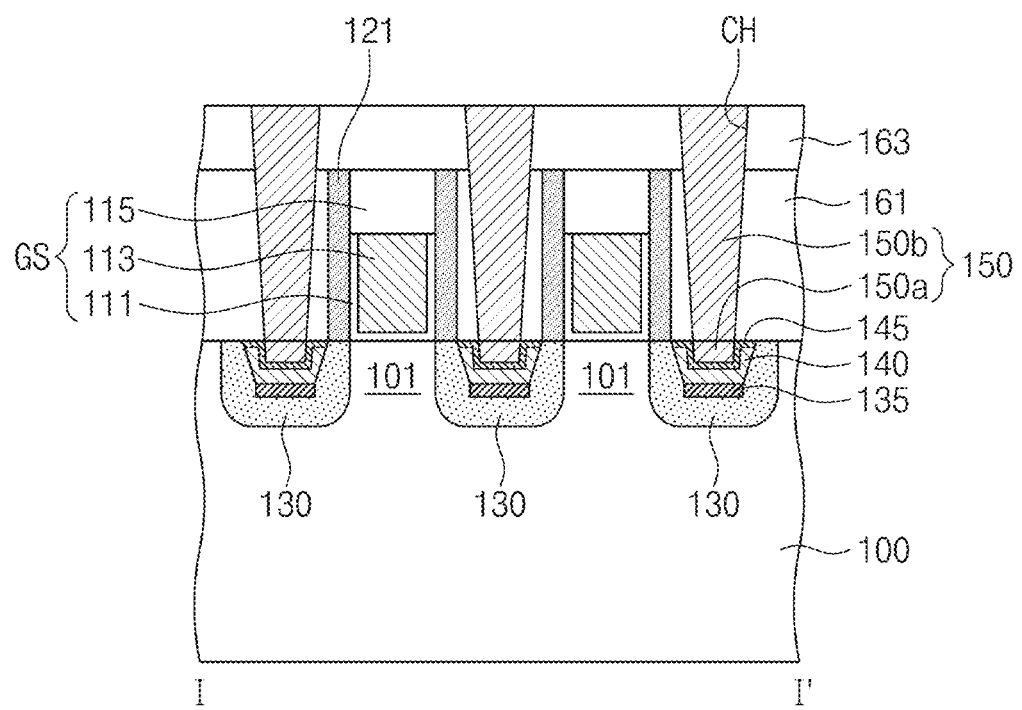

FIGS. 6A to 6C illustrate cross sectional views taken along line I-I' of FIG. 1, showing a method of fabricating a semiconductor device according to some example embodiments of the present inventive concepts.

The same technical features as those of the example embodiments discussed above with reference to FIGS. 5A to 5D may be omitted in the interest of brevity of description.

Referring to FIG. 6A, after the step discussed above in FIG. 5B, the lower contact pattern 140 may be formed in the source/drain region 130, and then a portion of the lower contact pattern 140 may be etched to form the second recess RS2.

Referring to FIG. 6B, the second metal barrier layer 145 may be formed on the second recess RS2 of the lower contact pattern 140. A selective deposition process may be employed to selectively deposit the second metal barrier layer 145 on the surface of the lower contact pattern 140 having the second recess RS2.

A first upper contact pattern 150a may be formed to fill the second recess RS2 in which the second metal barrier layer 145 is formed. The first upper contact pattern 150a may include a third metal whose resistivity is lower than that of the lower contact pattern 140.

Referring to FIG. 6C, the first interlayer dielectric layer 163 may be formed to cover the gate structures GS. The contact hole CH may be formed to penetrate the first interlayer dielectric layer 163 and to expose a portion of the first upper contact pattern 150a. The formation of the contact hole CH may include forming an etching mask on the first interlayer dielectric layer 163, and using the etching mask to etch a portion of the first interlayer dielectric layer 163 until the first upper contact pattern 150a is exposed.

A second upper contact pattern 150b may be formed in the contact hole CH, which second upper contact pattern 150b includes the same third metal as that of the first upper contact pattern 150a.

Figure 7:
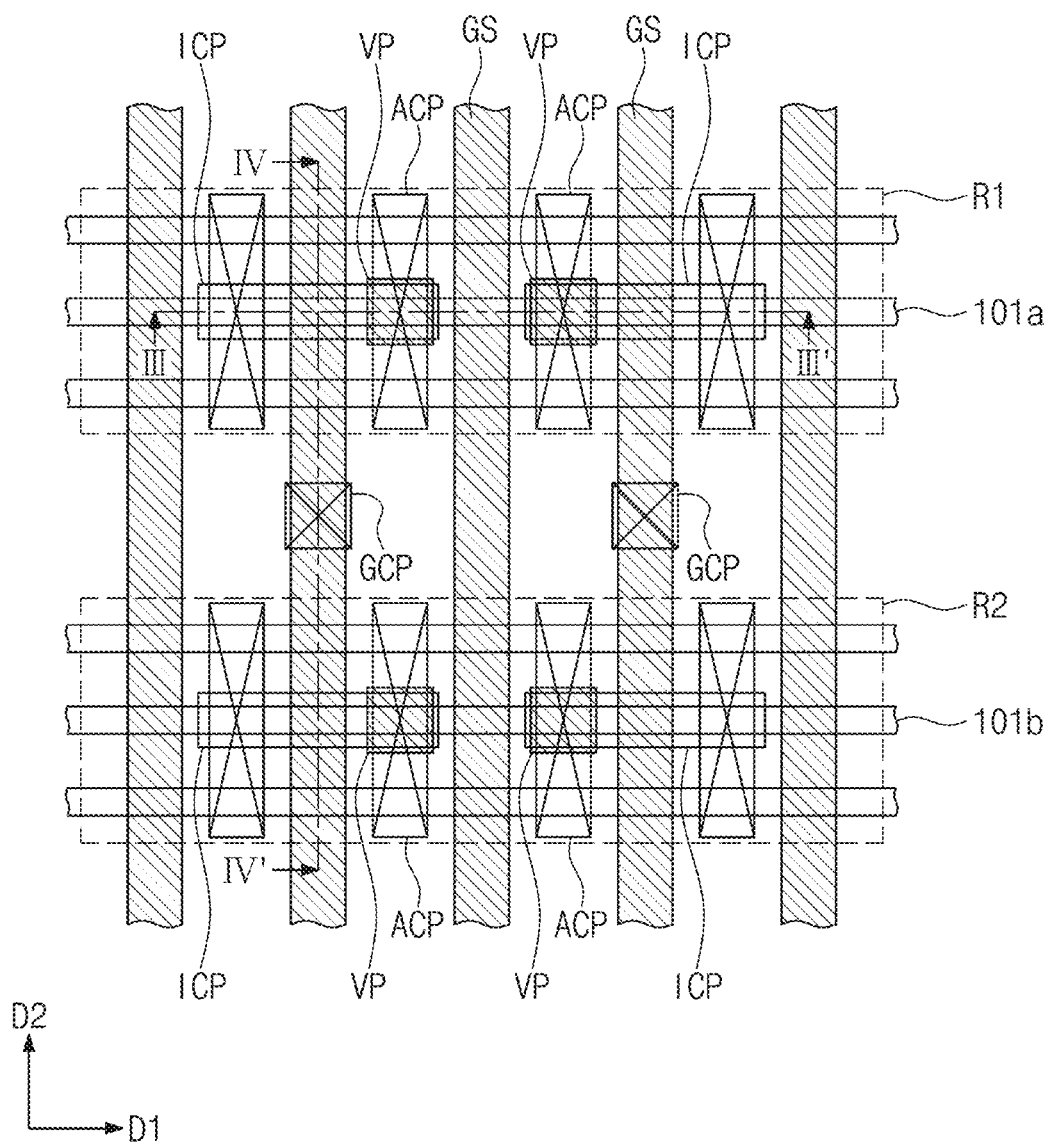
FIG. 7 illustrates a plan view showing a semiconductor device according to some example embodiments of the present inventive concepts.
Figure 8A:
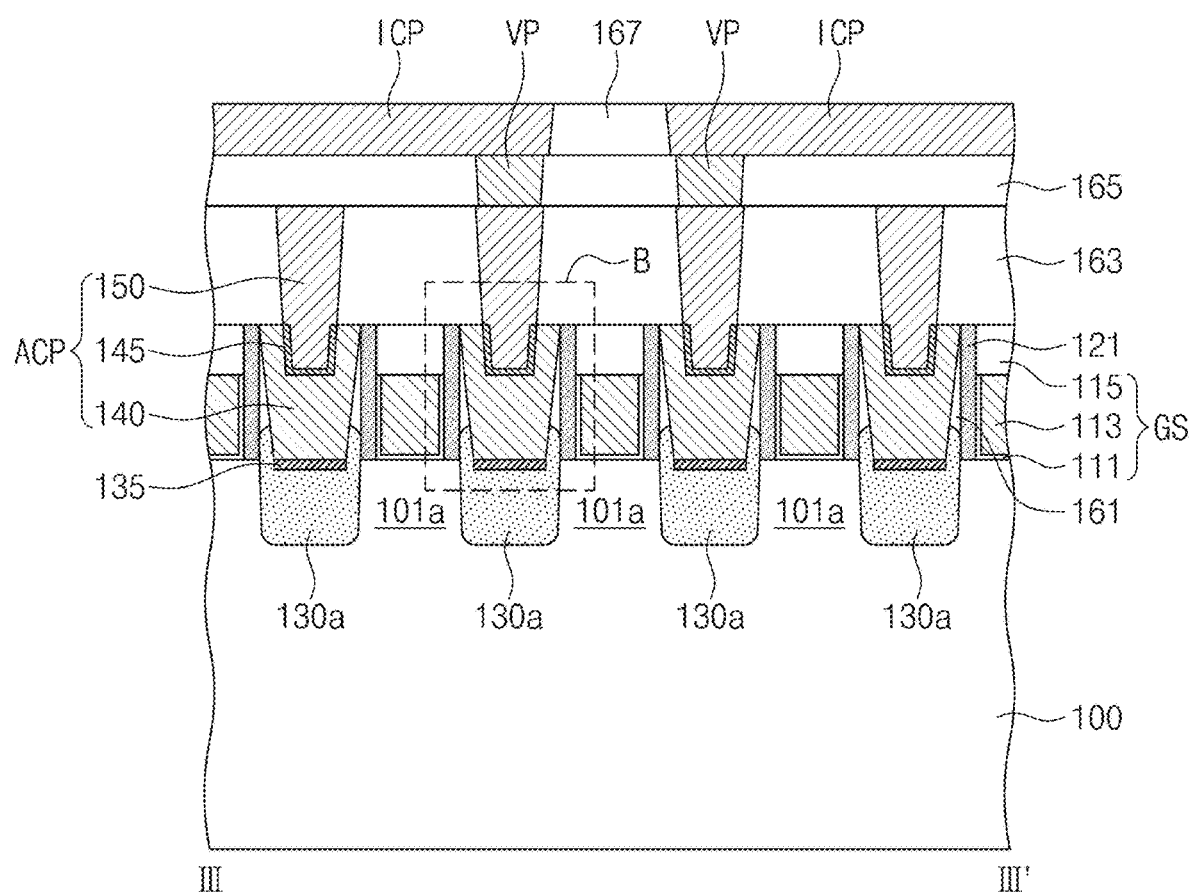
FIG. 8A illustrates a cross-sectional view taken along line III-III' of FIG. 7, showing a semiconductor device according to some example embodiments of the present inventive concepts.
Figure 8B:
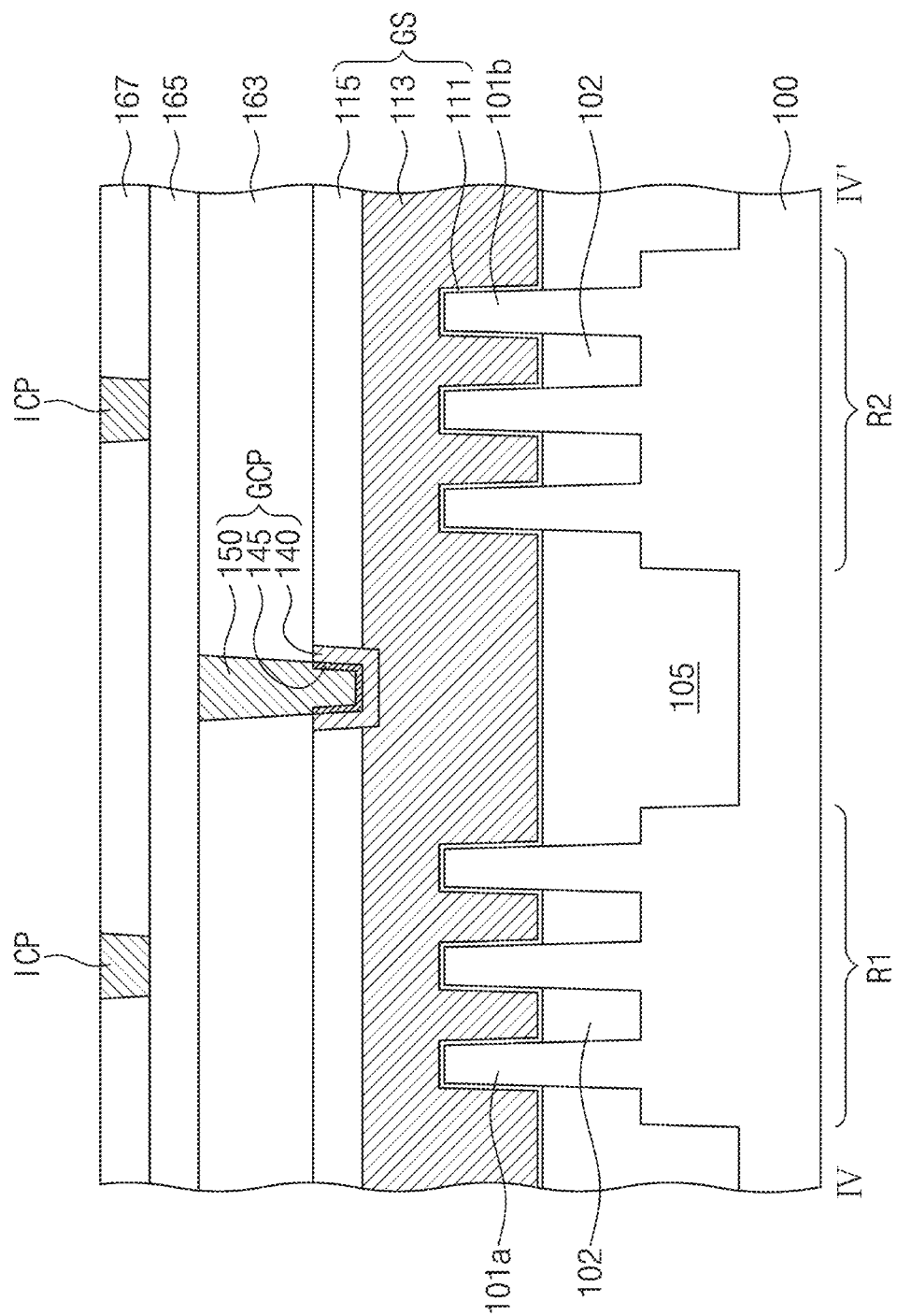
FIGS. 8B and 8C illustrate cross-sectional views taken along line IV-IV' of FIG. 7, showing semiconductor devices according to some example embodiments of the present inventive concepts.
Figure 8C:
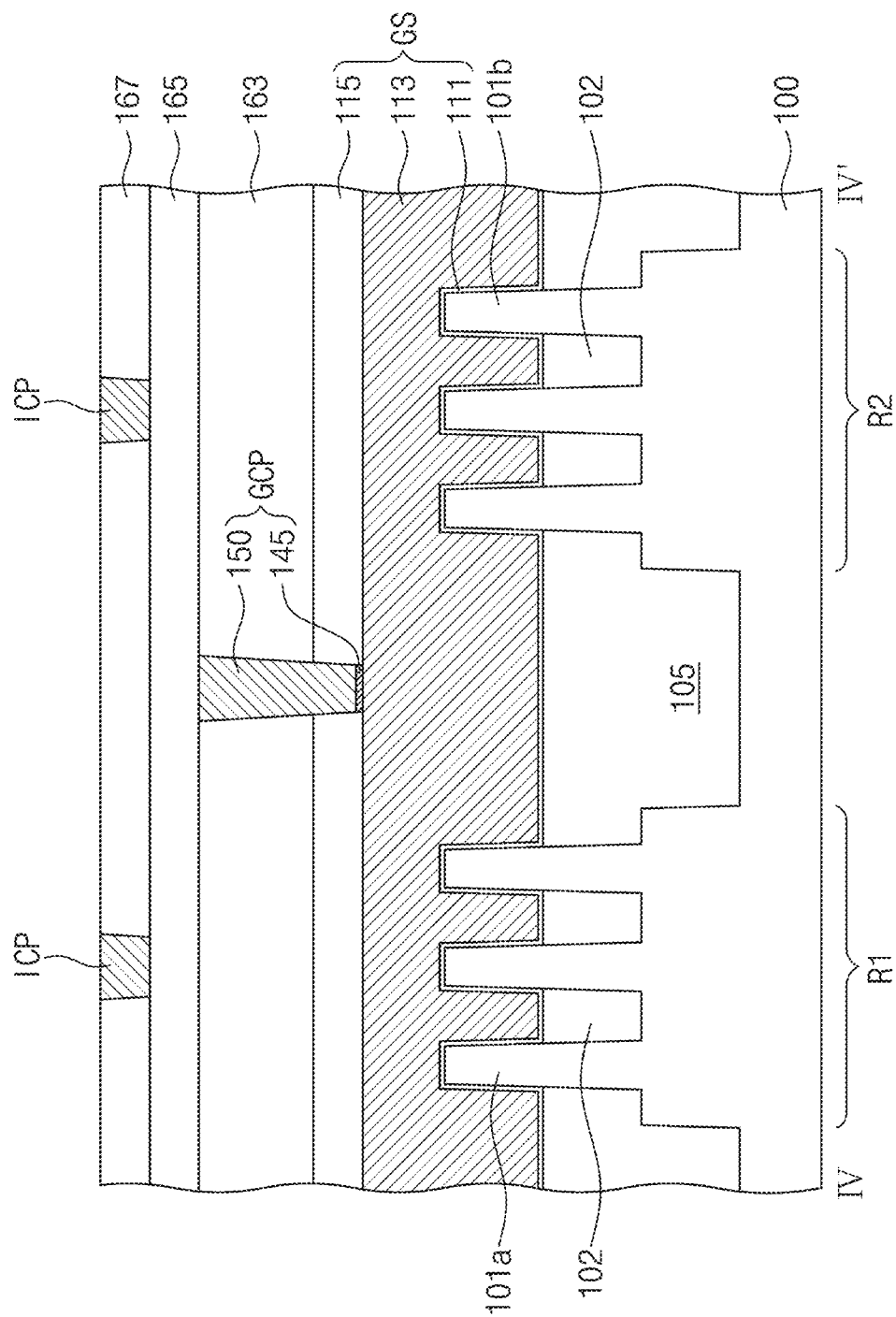

FIG. 7 illustrates a plan view showing a semiconductor device according to some example embodiments of the present inventive concepts. FIG. 8A illustrates a cross-sectional view taken along line III-III' of FIG. 7, showing a semiconductor device according to some example embodiments of the present inventive concepts. FIGS. 8B and 8C illustrate cross-sectional views taken along line IV-IV' of FIG. 7, showing semiconductor devices according to some example embodiments of the present inventive concepts.

The same technical features as those of the embodiments discussed with reference to FIGS. 1 and 2 may be omitted in the interest of brevity of description.

A semiconductor substrate 100 may include a first active region R1 and a second active region R2. The first and second active regions R1 and R2 may be included in a logic cell area where logic transistors that constitute a logic circuit of a semiconductor device are disposed. For example, PMOS field effect transistors may be provided on the first active region R1, and NMOS field effect transistors may be provided on the second active region R2. The semiconductor substrate 100 may include dopants whose conductivity type in the first active region R1 is different from that in the second active region R2.

On the first active region R1, a plurality of first active patterns 101a may extend in a first direction D1, and may be spaced apart from each other in a second direction D2 intersecting the first direction D1. On the second active region R2, a plurality of second active patterns 101b may extend in the first direction D1, and may be spaced apart from each other in the second direction D2 intersecting the first direction D1. The first and second active patterns 101a and 101b may be portions of the semiconductor substrate 100, and may be defined by first trenches formed on the semiconductor substrate 100. In an example embodiment, three first active patterns 101a are illustrated, but the number of the first active patterns 101a may be variously changed. The same may be true for the second active patterns 101b.

A first device isolation layer 102 may be disposed between the first active patterns 101a and between the second active patterns 101b. The first device isolation layer 102 may separate the first and second active patterns 101a and 101b from each other in the second direction D2. The first device isolation layer 102 may expose upper portions of the first and second active patterns 101a and 101b. For example, the first device isolation layer 102 may have a top surface lower than those of the first and second active patterns 101a and 101b, and the upper portions of the first and second active patterns 101a and 101b may protrude upwardly from the top surface of the first device isolation layer 102.

A second device isolation layer 105 may extend in the first direction D1 and may define the first active region R1 and the second active region R2. The second device isolation layer 105 may be provided between an outermost one of the first active patterns 101a of the first active region R1 and an adjacent outermost one of the second active patterns 101b of the second active region R2. The second device isolation layer 105 may have a width in the second direction D2 greater than that of the first device isolation layer 102. The second device isolation layer 105 may have a bottom surface at a level lower than, the same as, or substantially similar to that of a bottom surface of the first device isolation layer 102. The second device isolation layer 105 may separate the first and second active regions R1 and R2 from each other in the second direction D2.

Gate structures GS may extend in the second direction D2, while running across the first and second active patterns 101a and 101b of the first and second active regions R1 and R2. The gate structures GS may be arranged at a regular pitch. For example, the gate structures GS may have the same or substantially similar width, and may be spaced apart from each other at a regular interval.

Each of the gate structures GS may include a gate dielectric layer 111, a gate conductive pattern 113, and a capping dielectric pattern 115. Gate spacers 121 may be disposed on opposite sidewalls of each of the gate structures GS.

Source/drain patterns 130a may be disposed on opposite sides of each of the gate structures GS. The source/drain patterns 130a may include first source/drain patterns on upper portions of the first active patterns 101a and second source/drain patterns on upper portions of the second active patterns 101b. The first active patterns 101a or the second active patterns 101b may have portions (e.g., channel regions) between the source/drain patterns 130a that are horizontally spaced apart from each other.

When the first active region R1 is provided with an NMOS field effect transistor (FET), the first source/drain patterns may be configured to provide a tensile strain to a channel region of the NMOSFET (e.g., to an upper portion of the active pattern 101). For example, the first source/drain patterns may be epitaxial layers of silicon carbide (SiC). When the second active region R2 is provided with a PMOSFET, the second source/drain patterns may be configured to provide a compressive strain to a channel region of the PMOSFET. For example, the second source/drain patterns may be epitaxial layers of silicon germanium (SiGe).

The first source/drain patterns on the first active region R1 may include p-type impurities, and the second source/drain patterns on the second active region R2 may include n-type impurities. For example, the source/drain patterns 130a may be epitaxial layers grown from the first and second active patterns 101a and 101b. The first source/drain patterns on the first active region R1 may be epitaxial layers of silicon germanium (SiGe), and the second source/drain patterns on the second active region R2 may be epitaxial layers of silicon carbide (SiC). For example, the first source/drain patterns may have their volumes greater than those of the second source/drain patterns. The first source/drain patterns may have their bottom ends lower than those of the second source/drain patterns.

A gap-fill dielectric layer 161 may fill spaces between the gate structures GS and may cover the first and second source/drain patterns. For example, the gap-fill dielectric layer 161 may have a top surface coplanar or substantially coplanar with those of the gate structures GS.

The gap-fill dielectric layer 161 may be provided thereon with a first interlayer dielectric layer 163 that covers the top surfaces of the gate structures GS. The gap-fill dielectric layer 161 and the first interlayer dielectric layer 163 may be formed of a dielectric material having an etch selectivity with respect to the gate spacers 121, and may include one or more of a silicon oxide layer, a silicon nitride layer, a silicon oxynitride layer, and a low-k dielectric layer.

On the first and second active regions R1 and R2, active contact structures ACP may penetrate the first interlayer dielectric layer 163 and the gap-fill dielectric layer 161 and may be coupled to the source/drain patterns 130a.

Likewise the contact structure CP discussed above with reference to FIG. 2, each of the active contact structures ACP may include a lower contact pattern 140, an upper contact pattern 150, and a metal barrier layer 145 between the lower and upper contact patterns 140 and 150.

Figure 9:
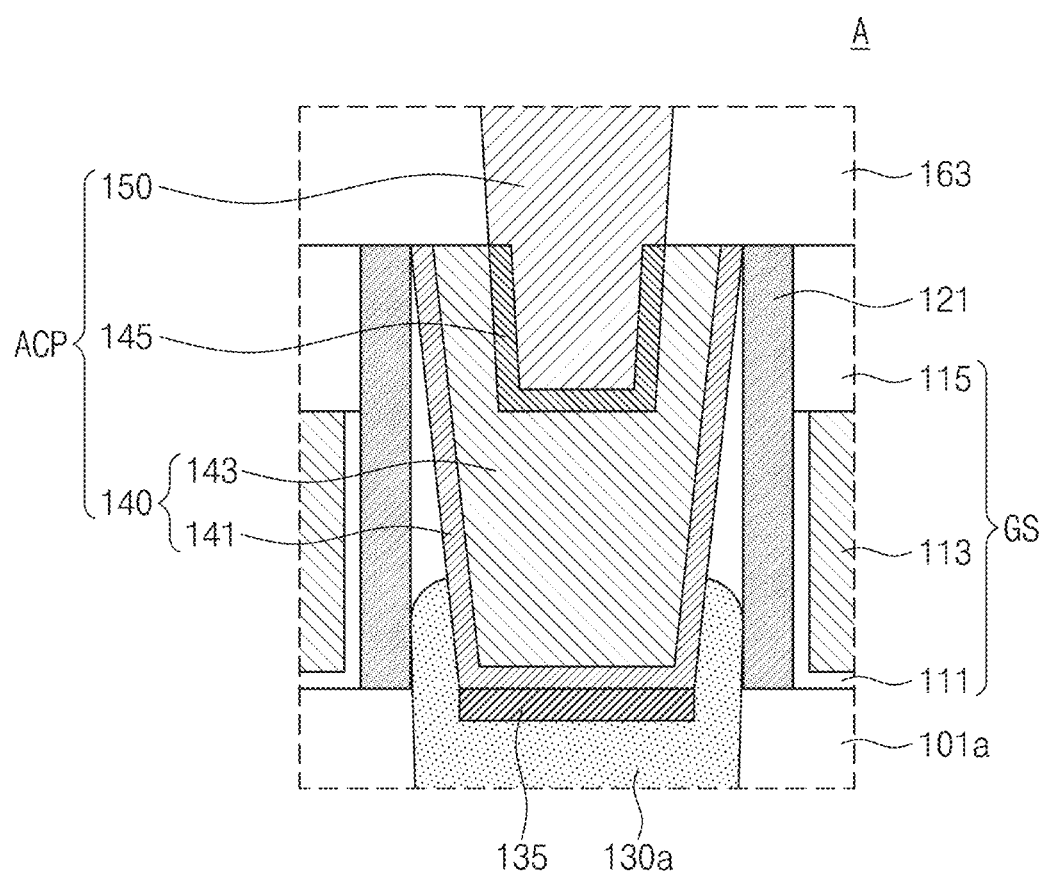
FIG. 9 illustrates an enlarged view showing section B of FIG. 8A.

For example, referring to FIG. 9, the lower contact pattern 140 may have a bottom at a lower level than that of tops of the source/drain patterns 130a. The lower contact pattern 140 may have a top at substantially the same level as that of the tops of the source/drain patterns 130a.

Referring back to FIGS. 7, 8A, and 8B, gate contact structures GCP may be coupled to corresponding gate conductive patterns 113 of the gate structures GS, respectively. The gate contact structure GCP may penetrate the first interlayer dielectric layer 163 and the capping dielectric pattern 115 of the gate structure GS. Although not specifically illustrated, the gate contact structure GCP may also penetrate the gap-fill dielectric layer 161. The gate contact structures GCP may be formed simultaneously with the active contact structures ACP, and may include the same metallic material as that of the active contact structures ACP. The gate contact structures GCP may have top surfaces coplanar or substantially coplanar with those of the active contact structures ACP.

For example, referring to FIG. 8B, likewise the active contact structures ACP, the gate contact structure GCP may include a lower contact pattern 140, a metal barrier layer 145, and an upper contact pattern 150, and a lower portion of the upper contact pattern 150 may be disposed in a recess defined by a top surface of the lower contact pattern 140.

For another example, referring to FIG. 8C, the gate contact structure GCP may include the metal barrier layer and the upper contact pattern, but not the lower contact pattern. In this case, the metal barrier layer may be in direct contact with the gate conductive pattern 113 of the gate structure GS.

Referring back to FIGS. 7, 8A, and 8B, via patterns VP may be disposed in a second interlayer dielectric layer 165 and may be coupled to the active contact structures ACP. The via patterns VP may include metal (e.g., one or more of tungsten, titanium, tantalum, cobalt, and copper), and conductive metal nitride (e.g., one of titanium nitride, tantalum nitride, and tungsten nitride).

An interconnection pattern ICP may be disposed in a third interlayer dielectric layer 167, and may be coupled to the via pattern VP. On each of the first and second active regions R1 and R2, the interconnection pattern ICP may run across one of the gate structures GS. For example, the interconnection pattern ICP may have a bar or linear shape extending in the first direction D1 on the second device isolation layer 105.

FIGS. 10A to 10D illustrate cross sectional views taken along line III-III' of FIG. 7, showing a method of fabricating a semiconductor device according to some example embodiments of the present inventive concepts.

Figure 10A:
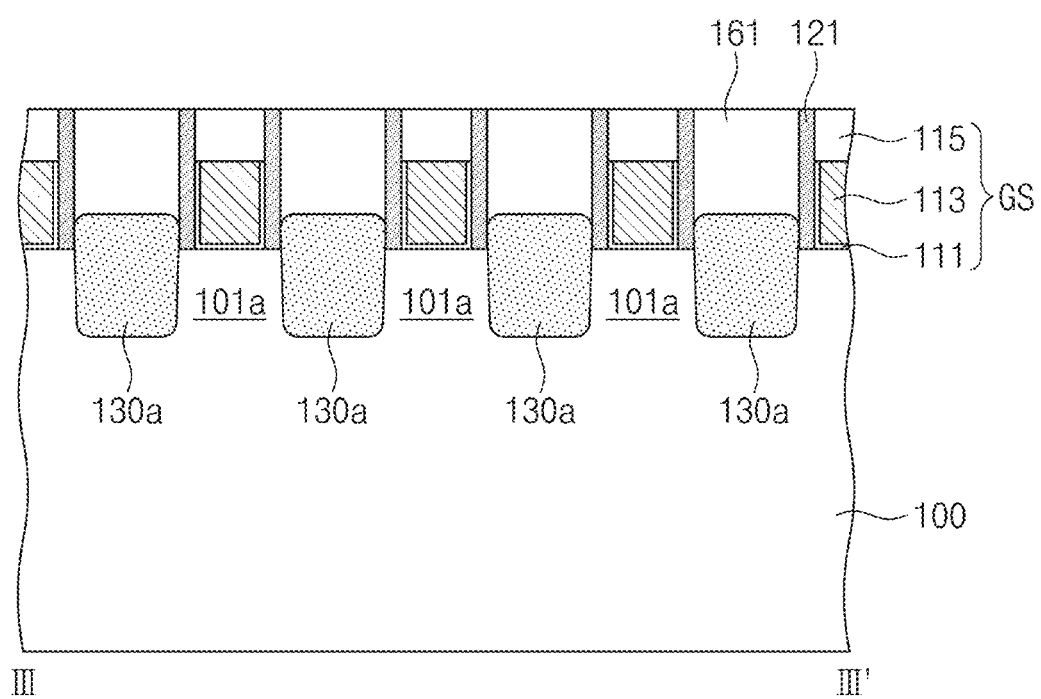
FIGS. 10A to 10D illustrate cross sectional views taken along line III-III' of FIG. 7, showing a method of fabricating a semiconductor device according to some example embodiments of the present inventive concepts.

Referring to FIG. 10A, a semiconductor substrate 100 may be patterned to form active patterns 101a that vertically protrude from the semiconductor substrate 100. A device isolation layer (see 102 of FIG. 8B) may be formed on opposite sides of the active pattern 101a. The device isolation layer 102 may have a top surface that is recessed from a top surface of the active pattern 101a.

Gate structures GS may be formed to run across the active pattern 101a. The formation of the gate structures GS may include forming a sacrificial gate pattern (not shown), forming gate spacers 121 on opposite sidewalls of the sacrificial gate pattern, sequentially forming a gate dielectric layer 111 and a gate conductive pattern 113 in a gate region between a pair of gate spacers 121 after removing the sacrificial gate pattern, and forming a capping dielectric pattern 115 on the gate dielectric layer 111 and the gate conductive pattern 113.

Source/drain patterns 130a may be formed on opposite sides of each of the gate structures GS. The source/drain patterns 130a may be formed by an epitaxial growth from the active pattern 101a. The source/drain patterns 130a may include epitaxial layers of silicon-germanium (SiGe) or silicon carbide (SiC).

According to some example embodiments, the formation of the source/drain patterns 130a may be followed by the formation of the gate structures GS including a metallic material. A gap-fill dielectric layer 161 may fill spaces between the gate structures GS.

Figure 10B:
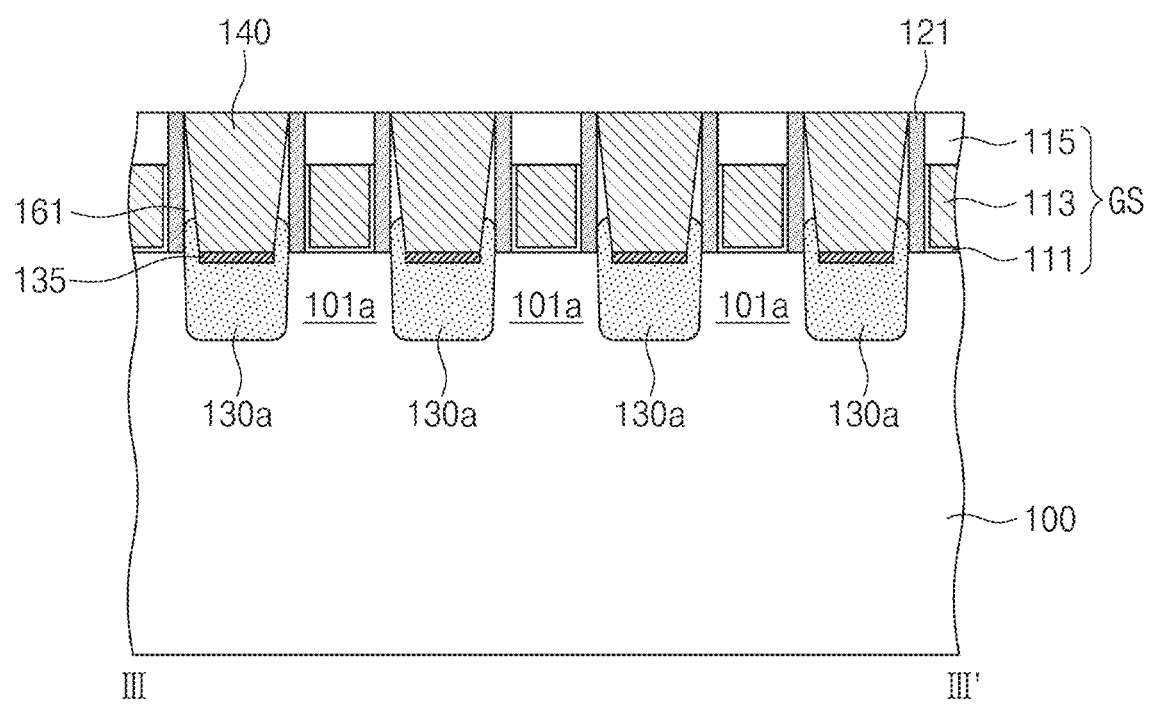

Referring to FIG. 10B, lower contact patterns 140 may be formed to penetrate the gap-fill dielectric layer 161, thereby being coupled to corresponding source/drain patterns 130a.

The formation of the lower contact patterns 140 may include depositing a first metal barrier layer and a first metal layer, as discussed above with reference to FIG. 5B.

While the lower contact patterns 140 are formed, silicide layers 135 may be formed between the source/drain patterns 130a and the lower contact patterns 140.

Figure 10C:
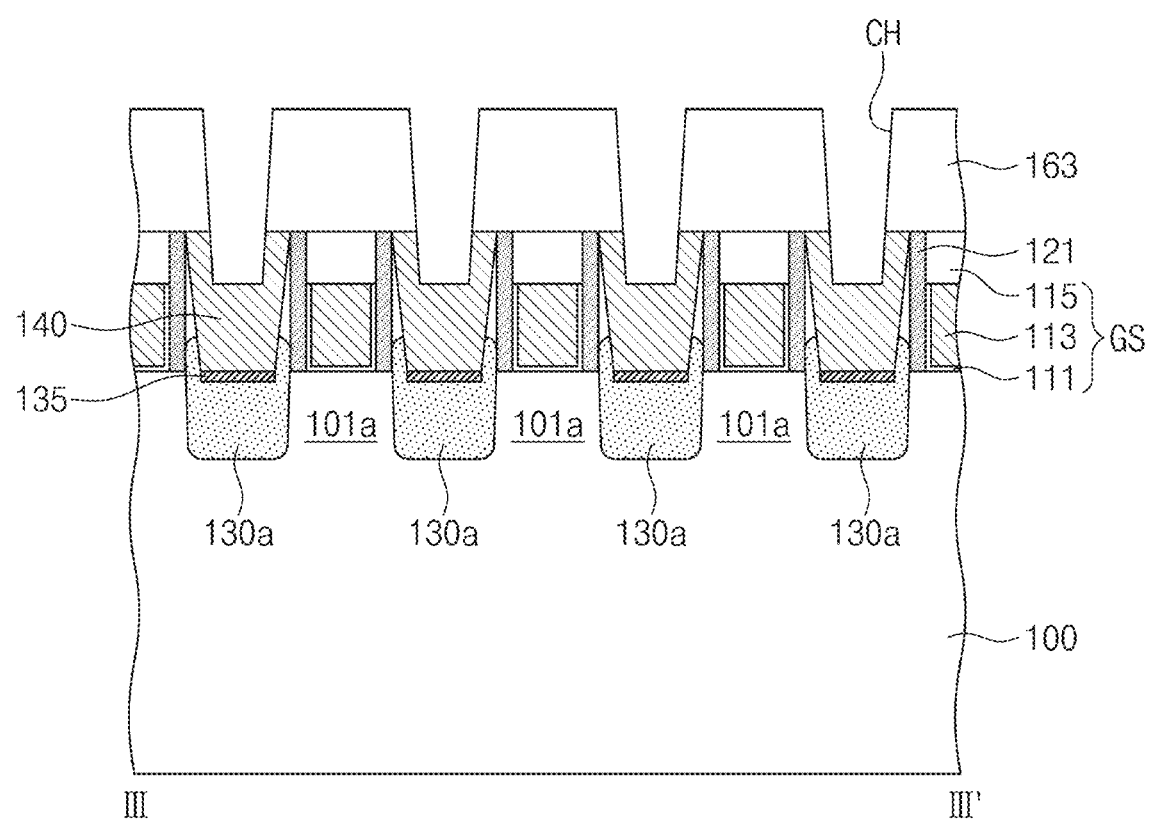

Referring to FIG. 10C, an interlayer dielectric layer 163 may be deposited on the lower contact patterns 140. The interlayer dielectric layer 163 may cover top surface of the lower contact patterns 140 and top surfaces of the gate structures GS.

Contact holes CH may be formed to penetrate the interlayer dielectric layer 163 and to expose portions of the lower contact patterns 140. The formation of the contact holes CH may include forming an etching mask on the interlayer dielectric layer 163, and using the etching mask to sequentially etch the interlayer dielectric layer 163 and portions of the lower contact patterns 140. Therefore, the top portion of the lower contact pattern 140 may be partially removed or recessed to form a recess. The recess may have a bottom surface at a lower level than that of the top surface of the gate structure GS.

Figure 10D:
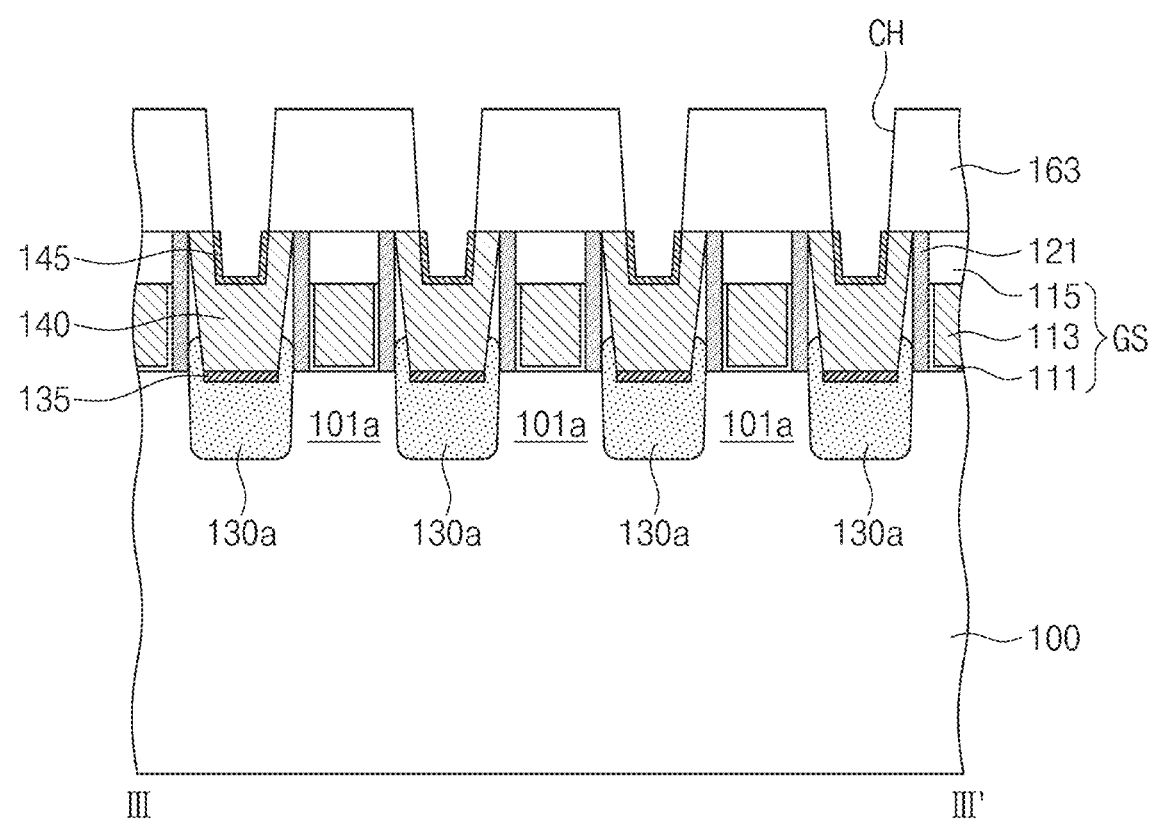

Referring to FIG. 10D, as discussed above with reference to FIG. 5D, a second metal barrier layer 145 may be formed on a surface of the lower contact pattern 140 exposed to the contact hole CH. The second metal barrier layer 145 may be deposited only on the surface of the lower contact pattern 140 exposed to the contact hole CH. The second metal barrier layer 145 may include a second metal different from a first metal of the lower contact pattern 140.

Upper contact patterns (see 150 of FIG. 8A) may be formed in the contact holes CH in each of which the second metal barrier layer 145 is formed. The upper contact patterns 150, as discussed above, may include a third metal different from the first metal of the lower contact pattern 140. The third metal may have lower resistivity than that of the first metal, and may include a noble metallic material.

Figure 11A:
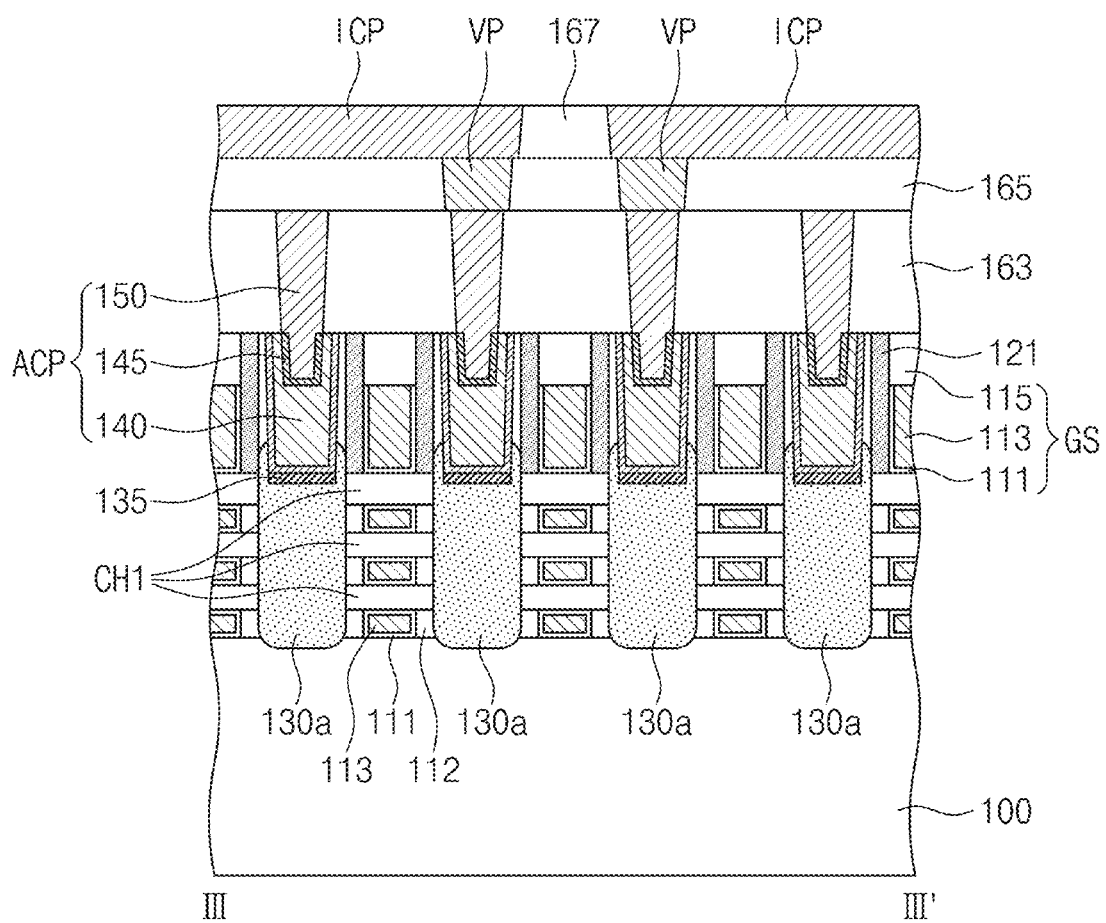
FIGS. 11A and 11B illustrate cross-sectional views respectively taken along lines III-III' and IV-IV' of FIG. 7, showing a semiconductor device according to some example embodiments of the present inventive concepts.
Figure 11B:
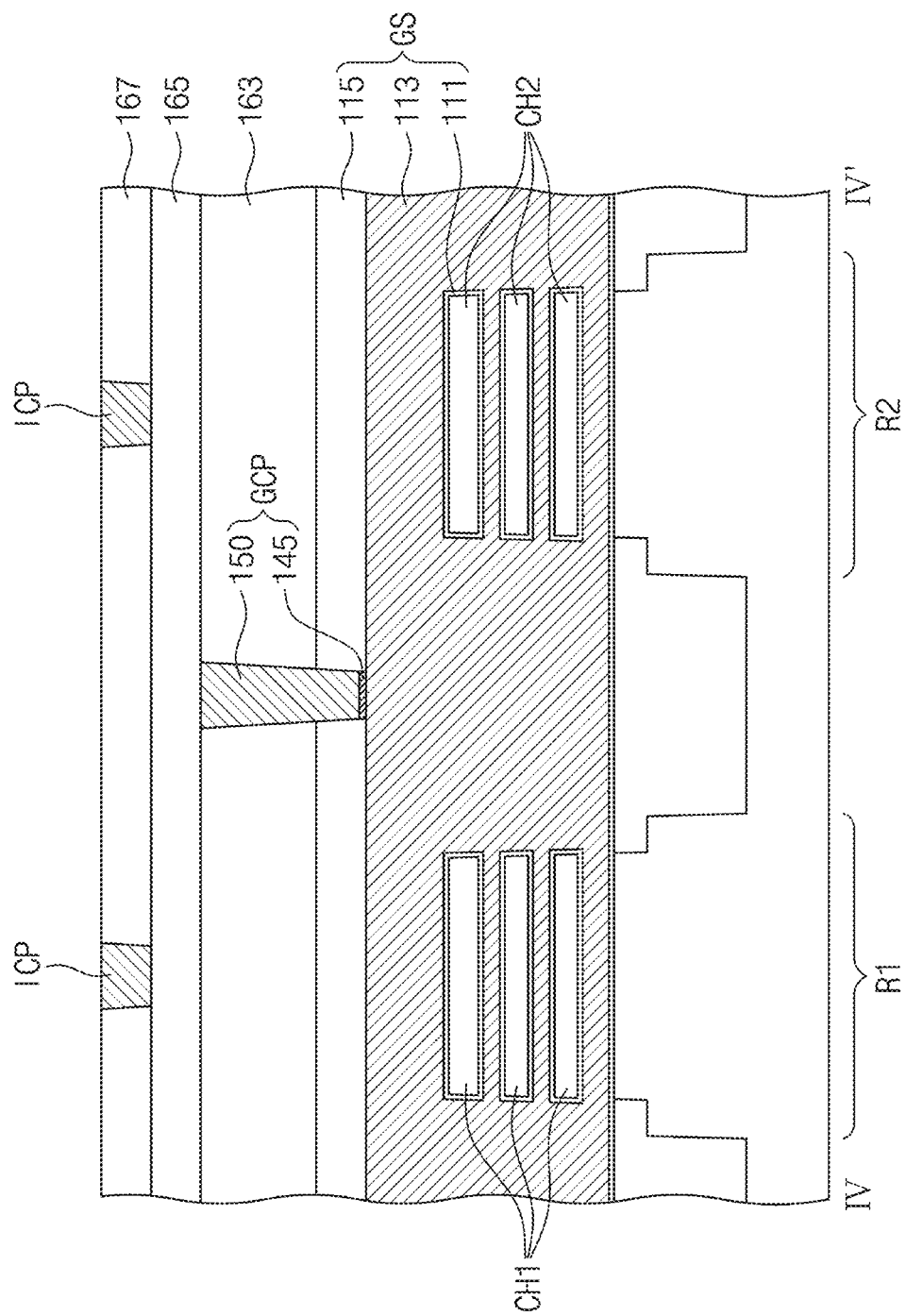

FIGS. 11A and 11B illustrate cross-sectional views respectively taken along lines III-III' and IV-IV' of FIG. 7, showing a semiconductor device according to some example embodiments of the present inventive concepts.

The same technical features as those of the embodiments discussed with reference to FIGS. 7, 8A, and 8C may be omitted in the interest of brevity of description.

A semiconductor device shown in FIGS. 11A and 11B may be a multi-bridge channel field effect transistor (MBCFET). The MBCFET may include a plurality of thin rectangular nano-sheet channels and a gate electrode that surrounds the channels up-and-down and right-and-left. The plurality of thin nano-sheets may be vertically stacked.

For example, referring to FIGS. 11A and 11B, each of the first active patterns 101a may be provided thereon with first channel patterns CH1 that are vertically stacked and spaced apart from each other. The first channel patterns CH1 stacked on the first active pattern 101a may vertically overlap each other.

Each of the second active patterns 101b may be provided thereon with second channel patterns CH2 that are vertically stacked and spaced apart from each other. The second channel patterns CH2 stacked on the second active pattern 101b may vertically overlap each other. The first and second channel patterns CH1 and CH2 may include one or more of silicon (Si), germanium (Ge), and silicon-germanium (SiGe).

The first source/drain patterns 130a may be provided on each of the first active patterns 101a. The stacked first channel patterns CH1 may be interposed between a pair of adjacent first source/drain patterns 130a. The stacked first channel patterns CH1 may connect the pair of adjacent first source/drain patterns 130a.

The second source/drain patterns may be provided on each of the second active patterns 101b. The stacked second channel patterns CH2 may be interposed between a pair of adjacent second source/drain patterns. The stacked second channel patterns CH2 may connect the pair of adjacent second source/drain patterns.

As discussed above, each of the gate structures GS may include the gate dielectric layer 111, the gate conductive pattern 113, and the capping dielectric pattern 115, and the gate spacers 121 may be disposed on opposite sidewalls of each of the gate structures GS. In some example embodiments, the capping dielectric pattern 115 may have a rounded bottom surface, and the rounded bottom surface may be in contact with a top surface of the gate conductive pattern 113. The rounded surface of the capping dielectric pattern 115 may be in contact with sidewalls of the gate spacers 121.

On each of the gate structures GS, the gate conductive pattern 113 may surround the first channel patterns CH1 and the second channel patterns CH2. For example, the gate conductive pattern 113 may surround top and bottom surfaces and opposite sidewalls of each of the first and second channel patterns CH1 and CH2. In this sense, transistors provided on first and second active regions R1 and R2 may be gate-all-around type field effect transistors.

The gate dielectric layer 111 may be provided the gate conductive pattern 113 and each of the first and second channel patterns CH1 and CH2. The gate dielectric layer 111 may surround a corresponding one of the first and second channel patterns CH1 and CH2.

Inner spacers 112 may be disposed below the gate spacers 121 and on sidewalls of the gate structure GS. When viewed in cross-section, the inner spacers 112 may be locally disposed between adjacent first channel patterns CH1 and between the first active pattern 101a and a lowermost one of the first channel patterns CH1. When viewed in plan, one or more of the inner spacers 112 may be locally disposed between the first source/drain patterns 130a and opposite sidewalls of the gate structure GS. The inner spacers 112 may be in contact with the gate dielectric layer 111 and may be formed of a dielectric material.

According to some embodiments, as discussed above, the active contact structures ACP may penetrate the first interlayer dielectric layer 163, and may be coupled to the first source/drain patterns 130a. Although not specifically illustrated, the active contact structure ACP may also penetrate the gap-fill dielectric layer 161. The active contact structures ACP may be disposed in portions of the first source/drain patterns 130a. The metal silicide layer 135 may be formed between the active contact structure ACP and the first source/drain pattern 130a.

The gate contact structure GCP may be coupled to the gate conductive pattern 113 of the gate structure GS. As discussed above, the gate contact structure GCP may include the same metallic material as that of the active contact structure ACP.

Figure 12:
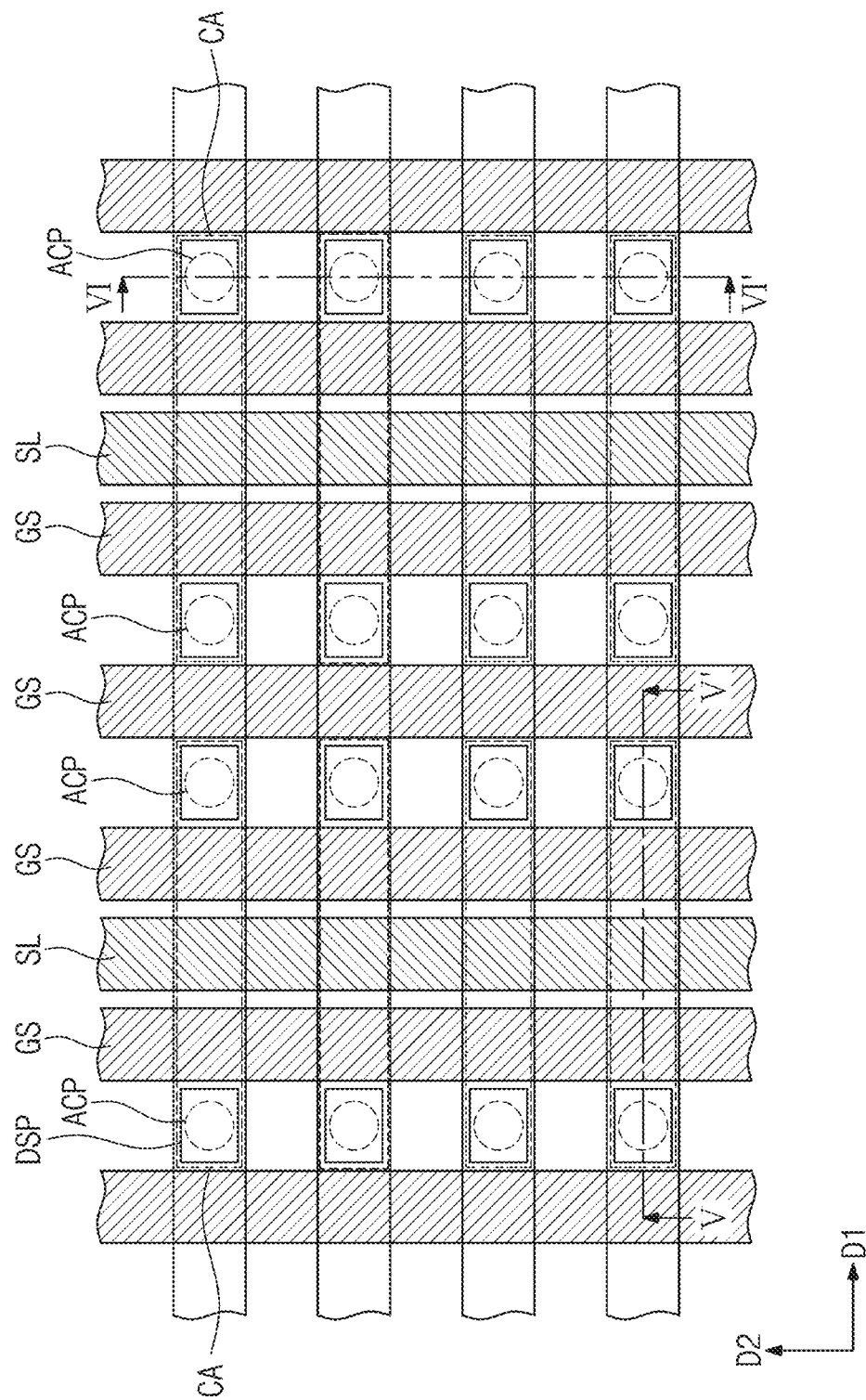
FIG. 12 illustrates a plan view showing a semiconductor device according to some example embodiments of the present inventive concepts.
Figure 13A:
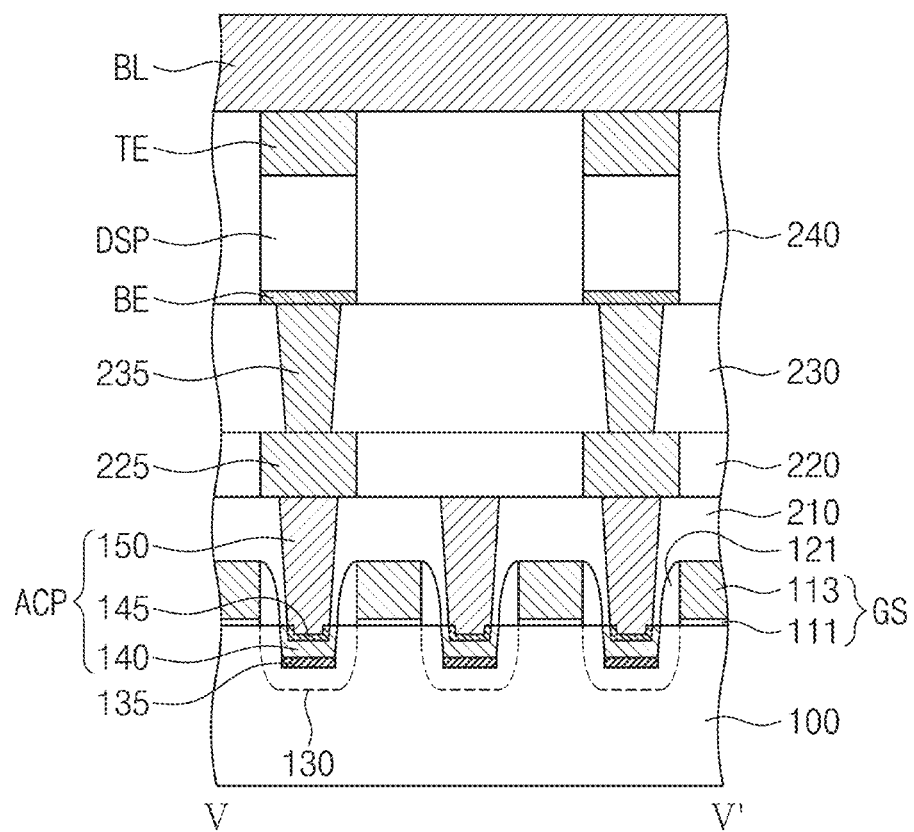
FIGS. 13A and 13B illustrate cross-sectional views respectively taken along lines V-V' and VI-VI' of FIG. 12, showing a semiconductor device according to some example embodiments of the present inventive concepts.
Figure 13B:
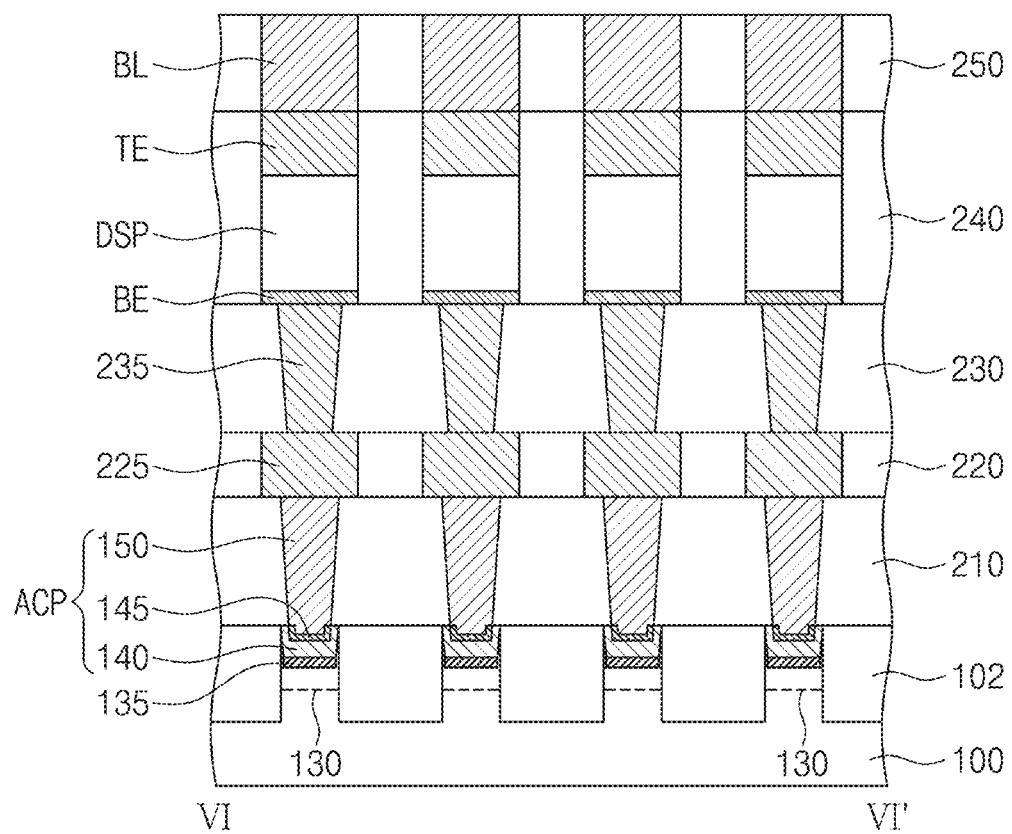

FIG. 12 illustrates a plan view showing a semiconductor device according to some example embodiments of the present inventive concepts. FIGS. 13A and 13B illustrate cross-sectional views respectively taken along lines V-V' and VI-VI' of FIG. 12, showing a semiconductor device according to some example embodiments of the present inventive concepts. The same technical features as those of the embodiments discussed with reference to FIGS. 1 and 2 may be omitted in the interest of brevity of description.

Referring to FIGS. 12, 13A, and 13B, a semiconductor substrate 100 may be provided thereon with selection transistors as selection elements of memory cells. The selection transistors may include cell active patterns CA, gate structures GS that run across the cell active patterns CA, and first and second impurity regions that are formed in the cell active patterns CA on opposite sides of each of the gate structures GS.

For example, a first region R1 of the semiconductor substrate 100 may be provided thereon with device isolation patterns 102 that define the cell active patterns CA. Each of the cell active patterns CA may be defined between the device isolation patterns 102 that are adjacent to each other. In an example embodiment, the cell active patterns CA may have a linear or bar shape having a major axis in a first direction D1. The cell active patterns CA may include impurities having a first conductivity type.

On the semiconductor substrate 100, the gate structures GS may run across the cell active patterns CA and the device isolation patterns 102. The gate structures GS may each have a linear shape extending in a second direction D2. A gate dielectric layer 111 may be disposed between the semiconductor substrate 100 and a cell gate electrode CG.

The gate structures GS may include, for example, one or more of a doped semiconductor material, metal, conductive metal nitride, and a metal-semiconductor compound. The gate dielectric layer 111 may include one or more of silicon oxide, silicon nitride, silicon oxynitride, and high-k dielectric.

Source/drain regions 130 may be disposed in the cell active patterns CA on opposite sides of each cell gate electrode CG. The source/drain regions 130 may be doped with dopants having a second conductivity type (e.g., n-type) different from the first conductivity type (e.g., p-type) of the cell active patterns CA.

A lower dielectric layer 210 may cover an entire surface of the semiconductor substrate 100. For example, the lower dielectric layer 210 may cover the selection transistors.

Source lines SL may penetrate the lower dielectric layer 210 and may have connection with one of the source/drain regions 130. The source lines SL may extend parallel to the gate structures GS. When viewed in plan, each of the source lines SL may be disposed between the gate structures GS that are adjacent to each other. The source line SL may have a top surface coplanar or substantially coplanar with that of the lower dielectric layer 210. Contact plugs ACP may penetrate the lower dielectric layer 210 and may have electrical connection with the source/drain regions 130.

According to some example embodiment, the source line SL and the contact plugs ACP may have the same characteristics as those of the contact structure discussed above.

The contact plugs ACP may be provided thereon with conductive pads 225 provided in a dielectric layer 220, and an intermediate dielectric layer 230 may be disposed on the conductive pads 225. Lower contact plugs 235 may be disposed in the intermediate dielectric layer 230. Data storage patterns DSP may be provided on the intermediate dielectric layer 230. When viewed in plan, the data storage patterns DSP may be arranged spaced apart from each other along the first and second directions D1 and D2 that intersect each other, and may be coupled to corresponding lower contact plugs 235. The data storage patterns DSP may be coupled to corresponding source/drain regions 130 through the lower contact plugs 235 and the contact plugs ACP. For example, the data storage patterns DSP may be electrically connected to corresponding selection transistors.

A bottom electrode BE may be disposed between the data storage pattern DSP and the lower contact plug 235. A top electrode TE may be provided on a top surface of the data storage pattern DSP. The top electrode TE, the data storage pattern DSP, and the bottom electrode BE may have their sidewalls aligned with each other.

The bottom electrode BE and the top electrode TE may include conductive metal nitride. For example, the bottom electrode BE may include one or more of titanium nitride (TiN), tantalum nitride (TaN), tungsten nitride (WN), and titanium aluminum nitride (TiAlN).

The intermediate dielectric layer 230 may be provided thereon with an upper dielectric layer 240 that fills spaces between the data storage patterns DSP.

The upper dielectric layer 240 may be provided thereon with bit lines BL disposed in a dielectric layer 250. Each of the bit lines BL may be in contact with the top electrodes TE that are arranged along the first direction D1.

Figure 14:
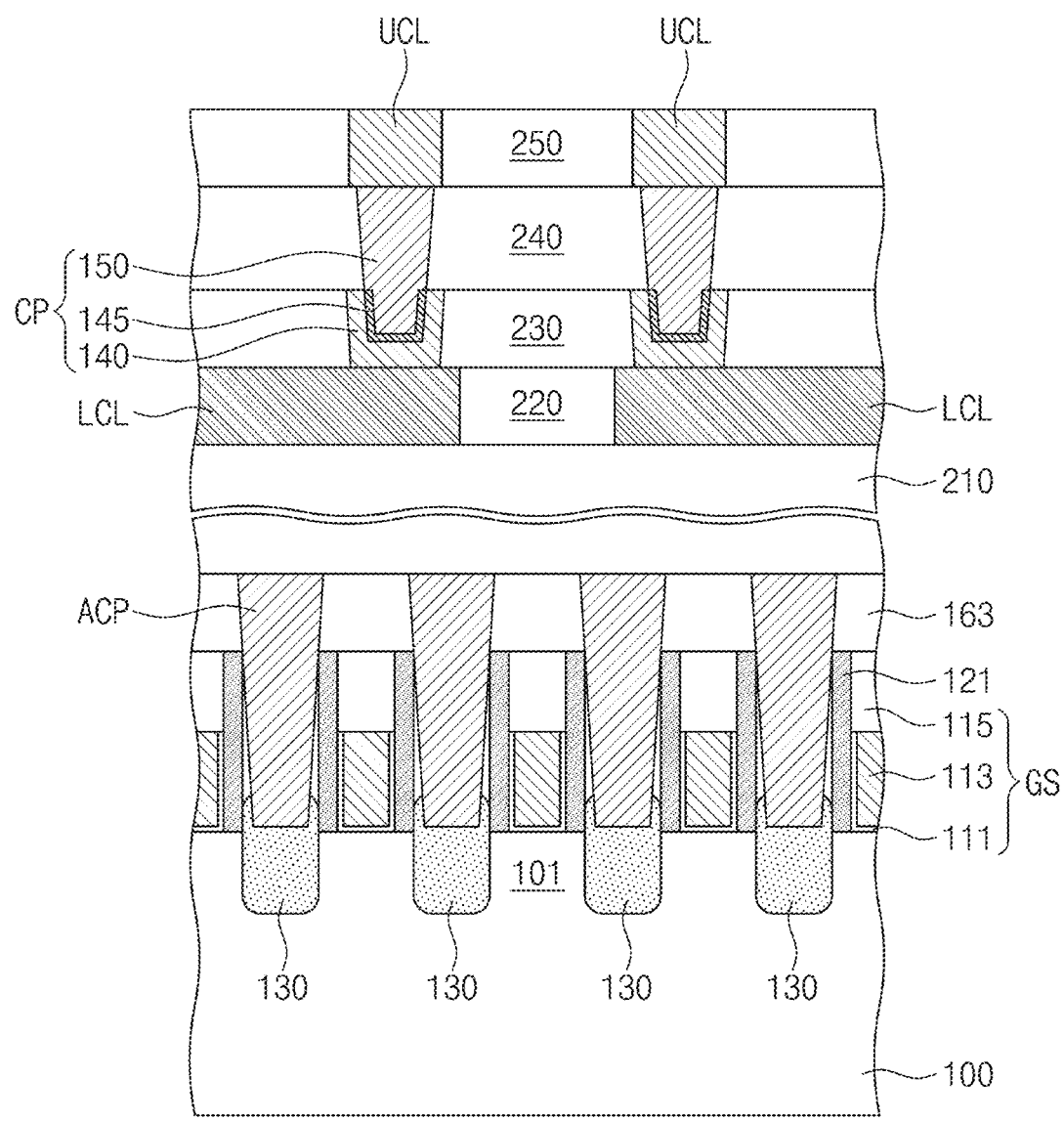
FIG. 14 illustrates a cross-sectional view showing a semiconductor device according to some example embodiments of the present inventive concepts.

FIG. 14 illustrates a cross-sectional view showing a semiconductor device according to some example embodiments of the present inventive concepts. The same technical features as those of the embodiments discussed with reference to FIGS. 1 and 2 may be omitted in the interest of brevity of description. In the example embodiment shown in FIG. 14, a contact structure CP may electrically connect an upper connection line UCL to a lower connection line LCL.

For example, referring to FIG. 14, a semiconductor substrate 100 may be provided thereon with gate structures GS that run across active patterns 101. Source/drain patterns 130 may be disposed in the active patterns 101 on opposite sides of each of the gate structures GS. The source/drain patterns 130 may be doped with dopants having a second conductivity type (e.g., n-type) different from a first conductivity type (e.g., p-type) of the active patterns 101.

A lower dielectric layer 210 may cover the gate structures GS and the source/drain patterns 130. Contact plugs ACP may penetrate an interlayer dielectric layer 163 and may be electrically coupled to the source/drain patterns 130. In an example embodiment, it is illustrated that the lower dielectric layer 210 covers the gate structures GS and the source/drain patterns 130, but the lower dielectric layer 210 may cover capacitors, resistors, contact plugs, and connection lines that are formed on the semiconductor substrate 100.

The lower dielectric layer 210 may be provided thereon with lower connection lines LCL disposed in a dielectric layer 220.

Intermediate and upper dielectric layers 230 and 240 may be stacked on the lower connection lines LCL, and the contact structure CP may penetrate the intermediate and upper dielectric layers 230 and 240, and may be coupled to the lower connection line LCL. As discussed above, the contact structure CP may include a lower contact pattern 140 including a first metal, a metal barrier layer 145 including a second metal, and an upper contact pattern 150 including a third metal. A lower portion of the upper contact pattern 150 may be disposed in a recess defined by a top surface of the lower contact pattern 140.

An upper connection line UCL disposed in a dielectric layer 250 may intersect the lower connection line LCL and may be coupled to the contact structure CP.

According to some example embodiments of the present inventive concepts, a semiconductor device may include a contact structure including lower and upper contact patterns. The upper contact pattern may include a second metal whose resistivity is lower below a certain width than that of a first metal of the lower contact pattern, and a portion of the upper contact pattern may be disposed in a recess of the lower contact pattern. Accordingly, the lower contact pattern may have reduced resistivity, and in turn, the contact structure may decrease in resistivity. Consequently, a signal delay through the contact structure may be reduced, thereby increasing an operation speed of the semiconductor device.

Although the present inventive concepts have been described in connection with some example embodiments illustrated in the accompanying drawings, it will be understood to those skilled in the art that various changes and modifications may be made without departing from the technical spirit and essential features of the present inventive concepts.

What is claimed is:

1. A semiconductor device, comprising:
   a lower contact pattern including a first metal;
   an upper contact pattern including a second metal, a first resistivity of first metal being greater than a second resistivity of the second metal;
   a metal barrier layer between the lower contact pattern and a lower portion of the upper contact pattern, the metal barrier layer including a third metal, the third metal being different from the first and second metals;
   a semiconductor layer;
   an interlayer dielectric layer on the semiconductor layer; and
   a conductive line on the interlayer dielectric layer,
   wherein the lower contact pattern is in the semiconductor layer,
   wherein the upper contact pattern penetrates the interlayer dielectric layer and connects the conductive line to the lower contact pattern, and
   wherein a lower width of the upper contact pattern is less than an upper width of the lower contact pattern.

2. The semiconductor device of claim 1, wherein a bottom surface of the upper contact pattern is between a top and a bottom of the lower contact pattern.

3. The semiconductor device of claim 1, further comprising:
   a lower metal barrier layer surrounding a bottom surface and a sidewall of the lower contact pattern.

4. The semiconductor device of claim 1, wherein the upper contact pattern is in the interlayer dielectric layer and the second metal included in the upper contact pattern is in direct contact with the interlayer dielectric layer.

5. The semiconductor device of claim 1, wherein the first metal includes one of cobalt (Co), titanium (Ti), nickel (Ni), tungsten (W), molybdenum (Mo), and tantalum (Ta).

6. The semiconductor device of claim 1, wherein the second metal includes one of rhenium (Re), ruthenium (Ru), rhodium (Rh), palladium (Pd), silver (Ag), osmium (Os), iridium (Ir), platinum (Pt), and gold (Au).

7. The semiconductor device of claim 1, wherein the third metal includes one of tungsten (W), molybdenum (Mo), manganese (Mn), indium (In), aluminum (Al), and nickel (Ni).

8. The semiconductor device of claim 1, wherein the first metal includes cobalt (Co), and the third metal includes ruthenium (Ru).

9. The semiconductor device of claim 1, wherein
   the semiconductor layer comprises a semiconductor substrate that includes an active pattern,
   the semiconductor device further comprises,
      a gate structure that runs across the active pattern, and
      a plurality of source/drain patterns in the active pattern on opposite sides of the gate structure, and
   the lower contact pattern is coupled to a corresponding one of the source/drain patterns.

10. The semiconductor device of claim 9, wherein a top surface of the lower contact pattern is at a same level as top surfaces of the source/drain patterns.

11. The semiconductor device of claim 9, further comprising:
    a metal silicide layer between the corresponding one of the source/drain patterns and the lower contact pattern.

12. A semiconductor device, comprising:
    a semiconductor substrate;
    an interlayer dielectric layer on the semiconductor substrate;
    a conductive line on the interlayer dielectric layer;
    an upper contact pattern penetrating the interlayer dielectric layer, the upper contact pattern including a first metal;
    a lower contact pattern surrounding a lower portion of the upper contact pattern, the lower contact pattern including a second metal, the second metal being different from the first metal; and
    a metal barrier layer between the lower contact pattern and the lower portion of the upper contact pattern, the metal barrier layer including a third metal different from the first and second metals,
    wherein the lower contact pattern has a first upper width and a first lower width less than the first upper width,
    wherein the upper contact pattern has a second upper width and a second lower width, both of which are less than the first lower width,
    wherein a bottom surface of the upper contact pattern is between a top and a bottom of the lower contact pattern,
    wherein the lower contact pattern is in the semiconductor substrate, and wherein the upper contact pattern penetrates the interlayer dielectric layer and connects the conductive line to the lower contact pattern.

13. The semiconductor device of claim 12, wherein the bottom surface of the upper contact pattern is lower than a bottom surface of the interlayer dielectric layer.

14. The semiconductor device of claim 12, wherein
at the first lower width, a first resistivity of the first metal is greater than a second resistivity of the second metal, and
at the second lower width, the first resistivity of the first metal is less than the second resistivity of the second metal.

15. The semiconductor device of claim 12, wherein the first metal includes ruthenium (Ru), and the second metal includes cobalt (Co).

16. A semiconductor device, comprising:
a semiconductor substrate including an active pattern;
a gate structure running across the active pattern and extending in a first direction;
a plurality of source/drain patterns on the active pattern, each of the source/drain patterns being on opposite sides of the gate structure; and
a contact structure coupled to a corresponding one of the source/drain patterns,
wherein the contact structure includes,
a lower contact pattern in the corresponding one of the source/drain patterns, the lower contact pattern including a first metal,
an upper contact pattern including a lower portion that is in a recess defined by a top surface of the lower contact pattern, the upper contact pattern including a second metal, and
a metal barrier layer between the lower contact pattern and the lower portion of the upper contact pattern, the metal barrier layer including a third metal, and
wherein a bottom of the upper contact pattern is lower than a top of the lower contact pattern.

17. The semiconductor device of claim 16, wherein
a first lower width of the lower contact pattern is greater than a second lower width of the upper contact pattern,
at the first lower width, a first resistivity of the first metal is less than a second resistivity of the second metal, and
at the second lower width, the second resistivity of the second metal is less than the first resistivity of the first metal.

18. The semiconductor device of claim 16, wherein the first metal includes cobalt (Co), and the second metal includes ruthenium (Ru).

19. The semiconductor device of claim 16, wherein the third metal includes tungsten (W) or molybdenum (Mo).

* * * * *